United States Patent
Kajiwara et al.

(10) Patent No.: US 12,151,255 B2
(45) Date of Patent: Nov. 26, 2024

(54) COATING APPARATUS AND COATING METHOD

(71) Applicant: TOKYO ELECTRON LIMITED, Tokyo (JP)

(72) Inventors: Hideki Kajiwara, Koshi (JP); Yuya Yonemitsu, Koshi (JP); Shinichiro Yamanaka, Koshi (JP); Shinichi Mizushino, Koshi (JP); Naruaki Iida, Koshi (JP); Kohei Kawakami, Koshi (JP); Tohru Azuma, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/218,457

(22) Filed: Jul. 5, 2023

(65) Prior Publication Data

US 2023/0347369 A1    Nov. 2, 2023

Related U.S. Application Data

(63) Continuation of application No. 16/897,922, filed on Jun. 10, 2020, now Pat. No. 11,752,515.

(30) Foreign Application Priority Data

Jun. 10, 2020    (JP) .................... 2019-18972

(51) Int. Cl.
  *B05B 12/04*    (2006.01)
  *B05B 7/00*    (2006.01)
(52) U.S. Cl.
  CPC ............. *B05B 12/04* (2013.01); *B05B 7/00* (2013.01)

(58) Field of Classification Search
  None
  See application file for complete search history.

(56) References Cited

U.S. PATENT DOCUMENTS

| 5,037,676 A | 8/1991 | Petropoulos |
| 5,240,556 A | 8/1993 | Ishikawa |

(Continued)

FOREIGN PATENT DOCUMENTS

| JP | 2004-039828 A | 2/2004 |
| JP | 2008-135679 A | 6/2008 |

(Continued)

*Primary Examiner* — Jethro M. Pence
(74) *Attorney, Agent, or Firm* — Nath, Goldberg & Meyer; Jerald L. Meyer; Tanya E. Harkins

(57) ABSTRACT

An apparatus includes substrate holders each configured to hold a substrate, a first nozzle provided for each substrate holder and for discharging a first processing liquid to the substrate at a first position, a second nozzle provided to be shared by the substrate holders and for discharging a second processing liquid to the substrate at a second position, a third nozzle provided for each substrate holder and for discharging a third processing liquid to the substrate at a third position while the first and second processing liquids are not supplied to the substrate, first to third standby parts for respectively allowing the first to third nozzles to wait outside a substrate holding region, a turning mechanism for turning the first nozzle between the first standby part and the first position, and a linear motion mechanism for linearly moving the third nozzle between the third standby part and the third position.

14 Claims, 20 Drawing Sheets

(56) References Cited

U.S. PATENT DOCUMENTS

| | | | |
|---|---|---|---|
| 5,254,367 A | 10/1993 | Matsumura | |
| 5,505,781 A | 4/1996 | Omori | |
| 5,681,614 A | 10/1997 | Omori | |
| 6,131,307 A | 10/2000 | Komino | |
| 6,186,171 B1 | 2/2001 | Tanaka | |
| 6,451,515 B2 | 9/2002 | Takamori | |
| 6,491,045 B2 | 12/2002 | Kamikawa | |
| 6,575,178 B1 * | 6/2003 | Kamikawa | H01L 21/02054 134/158 |
| 6,589,338 B1 | 7/2003 | Nakamori | |
| 6,589,339 B2 * | 7/2003 | Takeshita | H01L 21/6715 118/50 |
| 6,647,642 B2 | 11/2003 | Kamikawa | |
| 6,688,020 B2 | 2/2004 | Toshima | |
| 6,726,775 B2 * | 4/2004 | Takeshita | B05D 1/005 118/725 |
| 6,792,958 B2 | 9/2004 | Kamikawa | |
| 6,966,949 B2 | 11/2005 | Kobayashi | |
| 7,122,988 B2 | 10/2006 | Sato | |
| 7,205,025 B2 | 4/2007 | Kobayashi | |
| 7,275,553 B2 * | 10/2007 | Orii | H01L 21/67051 134/102.1 |
| 7,337,792 B2 * | 3/2008 | Kamikawa | H01L 21/67781 134/148 |
| 7,343,698 B2 | 3/2008 | Sugimoto | |
| 7,354,484 B2 | 4/2008 | Orii | |
| 7,615,117 B2 | 11/2009 | Kobayashi | |
| 7,758,341 B2 | 7/2010 | Dong-Hun | |
| 7,849,864 B2 | 12/2010 | Matusmoto | |
| 7,891,366 B2 * | 2/2011 | Ito | G03F 7/3021 134/201 |
| 8,037,891 B2 | 10/2011 | Kanno | |
| 8,042,560 B2 | 10/2011 | Ito | |
| 8,277,884 B2 | 10/2012 | Kobayashi | |
| 8,408,158 B2 | 4/2013 | Akimoto | |
| 8,469,285 B2 * | 6/2013 | Nakashima | B05C 5/0225 118/302 |
| 8,528,889 B2 | 9/2013 | Nakano | |
| 8,591,224 B2 | 11/2013 | Doug-Hun | |
| 8,887,741 B2 | 11/2014 | Higashijima | |
| 8,937,014 B2 * | 1/2015 | Tanaka | H01L 21/288 438/758 |
| 8,940,365 B2 * | 1/2015 | Miyata | H01L 21/6715 700/121 |
| 8,944,078 B2 | 2/2015 | Kamikawa | |
| 9,070,549 B2 * | 6/2015 | Tanaka | H01L 21/02052 |
| 9,073,103 B2 | 7/2015 | Morita | |
| 9,105,671 B2 * | 8/2015 | Itoh | G01B 21/20 |
| 9,224,283 B2 | 12/2015 | Kaneko | |
| 9,281,220 B2 * | 3/2016 | Takimoto | H01L 21/67051 |
| 9,287,145 B2 | 3/2016 | Nakaharada | |
| 9,355,871 B2 | 5/2016 | Higashijima | |
| 9,460,942 B2 | 10/2016 | Nakaharada | |
| 9,536,761 B2 | 1/2017 | Amano | |
| 9,662,685 B2 | 5/2017 | Goshi | |
| 9,732,910 B2 | 8/2017 | Takayanagi | |
| 9,773,687 B2 | 9/2017 | Wakiyama | |
| 9,846,363 B2 | 12/2017 | Yoshihara | |
| 9,881,784 B2 | 1/2018 | Ohno | |
| 9,953,848 B2 | 4/2018 | Wakiyama | |
| 9,984,904 B2 | 5/2018 | Nakaharada | |
| 9,984,905 B2 | 5/2018 | Nakaharada | |
| 10,046,370 B2 | 8/2018 | Goshi | |
| 10,056,269 B2 | 8/2018 | Minamida | |
| 10,115,609 B2 * | 10/2018 | Mitsuoka | H01L 21/02101 |
| 10,449,577 B2 | 10/2019 | Hashimoto | |
| 10,529,604 B2 | 1/2020 | Hayakawa | |
| 10,573,539 B2 * | 2/2020 | Komiya | H01L 21/67051 |
| 10,643,865 B2 * | 5/2020 | Amano | B08B 1/12 |
| 11,532,492 B2 * | 12/2022 | Morikawa | H01L 21/67742 |
| 2001/0023522 A1 | 9/2001 | Watson | |
| 2009/0056764 A1 | 3/2009 | Minami | |
| 2010/0154712 A1 | 6/2010 | Tamura | |
| 2010/0223805 A1 | 9/2010 | Hyakutake | |
| 2011/0180002 A1 | 7/2011 | Tanaka | |
| 2012/0031339 A1 | 2/2012 | Ono | |
| 2012/0115313 A1 * | 5/2012 | Sato | H05K 3/125 438/478 |
| 2014/0137893 A1 | 5/2014 | Otsuka | |
| 2015/0258584 A1 | 9/2015 | Mitsuoka | |
| 2017/0011907 A1 | 1/2017 | Mitsuoka | |
| 2017/0076938 A1 | 3/2017 | Mitsuoka | |
| 2017/0345689 A1 | 11/2017 | Wakiyama | |
| 2019/0019701 A1 | 1/2019 | Hayakawa | |
| 2019/0067041 A1 * | 2/2019 | Fujita | H01L 21/6838 |
| 2021/0001357 A1 | 1/2021 | Oh | |
| 2021/0159096 A1 * | 5/2021 | Sakai | B08B 3/00 |
| 2021/0265177 A1 | 8/2021 | Sawashima | |
| 2021/0265178 A1 | 8/2021 | Sawashima | |
| 2022/0154342 A1 * | 5/2022 | Morikawa | H01L 21/02068 |
| 2022/0165596 A1 * | 5/2022 | Watanabe | G03F 7/16 |
| 2022/0205090 A1 | 6/2022 | Kim | |
| 2022/0208569 A1 | 6/2022 | Kim | |
| 2022/0362813 A1 * | 11/2022 | Nakashoya | B08B 3/022 |
| 2022/0395776 A1 * | 12/2022 | Tsugao | B01D 53/68 |
| 2022/0399209 A1 * | 12/2022 | Tsugao | H01L 21/67178 |

FOREIGN PATENT DOCUMENTS

| | | |
|---|---|---|
| JP | 2009-181982 A | 8/2009 |
| JP | 2010-034210 A | 2/2010 |
| JP | 2010-056315 A | 3/2010 |
| JP | 2013-062330 A | 4/2013 |

* cited by examiner

COATING APPARATUS AND COATING METHOD

CROSS-REFERENCE TO RELATED APPLICATION

This is a Continuation Application of U.S. patent application Ser. No. 16/897,922, filed Jun. 10, 2020, an application claiming the benefit from Japanese Application No. 2019-108972, filed Jun. 11, 2019, the content of each of which are hereby incorporated by reference in their entirety.

TECHNICAL FIELD

The present disclosure relates to a coating apparatus and a coating method.

BACKGROUND

In a process of manufacturing a semiconductor device, a coating apparatus is used, and a processing liquid for forming a coating film such as a resist is supplied to a semiconductor wafer (hereinafter, referred to as a "wafer"), which is a substrate, to form the coating film. Patent Document 1 discloses a liquid processing apparatus, which is a coating apparatus including two processing parts configured to process a wafer, a nozzle group consisting of a large number of nozzles, a temperature adjustment unit configured to hold the nozzle group on standby, and a nozzle moving mechanism. The above-described nozzle moving mechanism moves one nozzle selected from the nozzle group between the processing parts and the temperature adjustment unit. The above-described nozzle moving mechanism, the nozzle group, and the temperature adjustment unit are commonly used by the two processing parts.

PRIOR ART DOCUMENT

[Patent Document]
Patent Document 1: Japanese Laid-Open Patent Publication No. 2010-034210

SUMMARY

According to one embodiment of the present disclosure, there is provided a coating apparatus including: a plurality of substrate holders each configured to hold a substrate; a first nozzle provided for each of the plurality of substrate holders and configured to discharge a first processing liquid to the substrate at a first discharge position on the substrate held by each of the plurality of substrate holders; a second nozzle provided to be shared by the plurality of substrate holders and configured to move independently of the first nozzle and configured to discharge a second processing liquid for forming a coating film to the substrate at a second discharge position on the substrate held by each of the plurality of substrate holders, after the discharge of the first processing liquid; a third nozzle provided for each of the plurality of substrate holders and configured to move independently of the first nozzle and the second nozzle and configured to discharge a third processing liquid to the substrate at a third discharge position on the substrate held by each of the plurality of substrate holders while the first processing liquid and the second processing liquid are not supplied to the substrate; a first standby part, a second standby part, and a third standby part, configured to respectively allow the first nozzle, the second nozzle, and the third nozzle to wait outside a region in which the substrate is held by each of the plurality of substrate holders in a plan view; a turning mechanism configured to turn the first nozzle in a plan view between the first standby part and the first discharge position; and a linear motion mechanism configured to linearly move the third nozzle in a plan view between the third standby part and the third discharge position.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
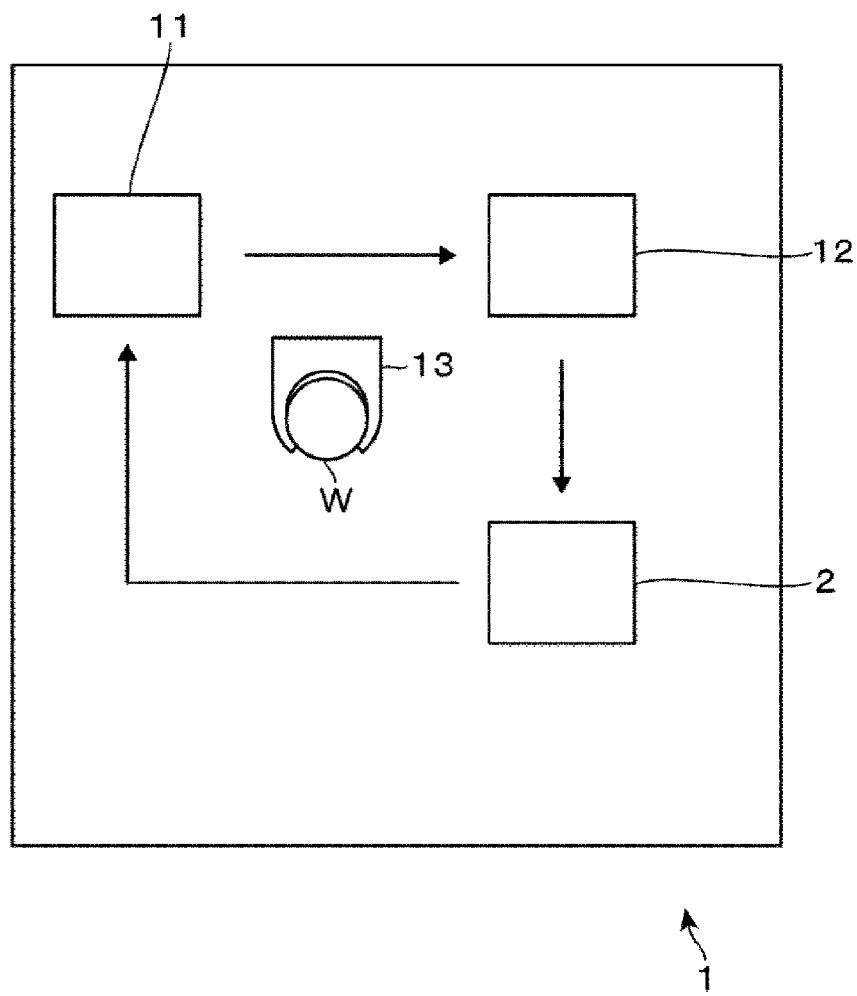
FIG. 1 is a schematic diagram of a substrate processing apparatus including a resist coating module according to an embodiment of the present disclosure.

FIG. 1 illustrates a substrate processing apparatus 1 including a resist coating module 2 which is an embodiment of a coating apparatus of the present disclosure. A carrier 11 that stores a plurality of wafers W is transferred to the substrate processing apparatus 1. In addition, the substrate processing apparatus 1 includes a temperature adjustment module 12 and a transfer mechanism 13. The transfer mechanism 13 transfers the wafer W in the order of the carrier 11, the temperature adjustment module 12, the resist coating module 2, and the carrier 11. The temperature adjustment module 12 adjusts the temperature of the wafer W to a predetermined temperature such that the wafer W is appropriately processed by the resist coating module 2. Then, when the temperature adjustment of the wafer W is completed and the wafer W can be unloaded, the temperature adjustment module 12 outputs a predetermined signal (hereinafter referred to as an "unload signal") to a controller 100 to be described later.

Next, the resist coating module 2, which is a coating apparatus, will be described with reference to a plan view of FIG. 2. The resist coating module 2 discharges a thinner, which is a first processing liquid, onto the wafer W, and discharges a resist, which is a second processing liquid, after the discharge of the thinner, thus forming a resist film as a costing film on the wafer W. The above-described discharge of the thinner is performed in order to execute a cleaning process for removing foreign substances on a front surface of the wafer W, and also serves as pre-wetting for increasing the wettability of the resist on the front surface of the wafer W. The above-described discharge of the resist is performed by selecting one of a plurality of nozzles, which discharge different types of resists, respectively, whereby a resist film corresponding to the lot of the wafer W can be formed. In addition, in the resist coating module 2, after forming the resist film, edge bead removal (EBR) for discharging a thinner, which is a third processing liquid, to the peripheral edge portion of the wafer W so as to remove an unnecessary portion of the resist film in a ring shape, is performed.

The resist coating module 2 includes a horizontally-elongated rectangular housing 21. Inside the housing 21, processing parts 22A, 22B, and 22C, each configured to process the wafer W, are provided in this order in a horizontal direction. Each of the processing parts 22 (22A to 22C) has a member configured to place the wafer W thereon so as to perform the cleaning process and the EBR. A resist supply mechanism 6 shared by the three processing parts 22 is also provided inside the housing 21. Assuming that the cleaning of the wafer W, the formation of a resist film performed by the resist coating following the cleaning, and the EBR after the formation of the resist film are a series of processes, the series of processes may be performed in the processing parts 22, respectively.

Figure 2:
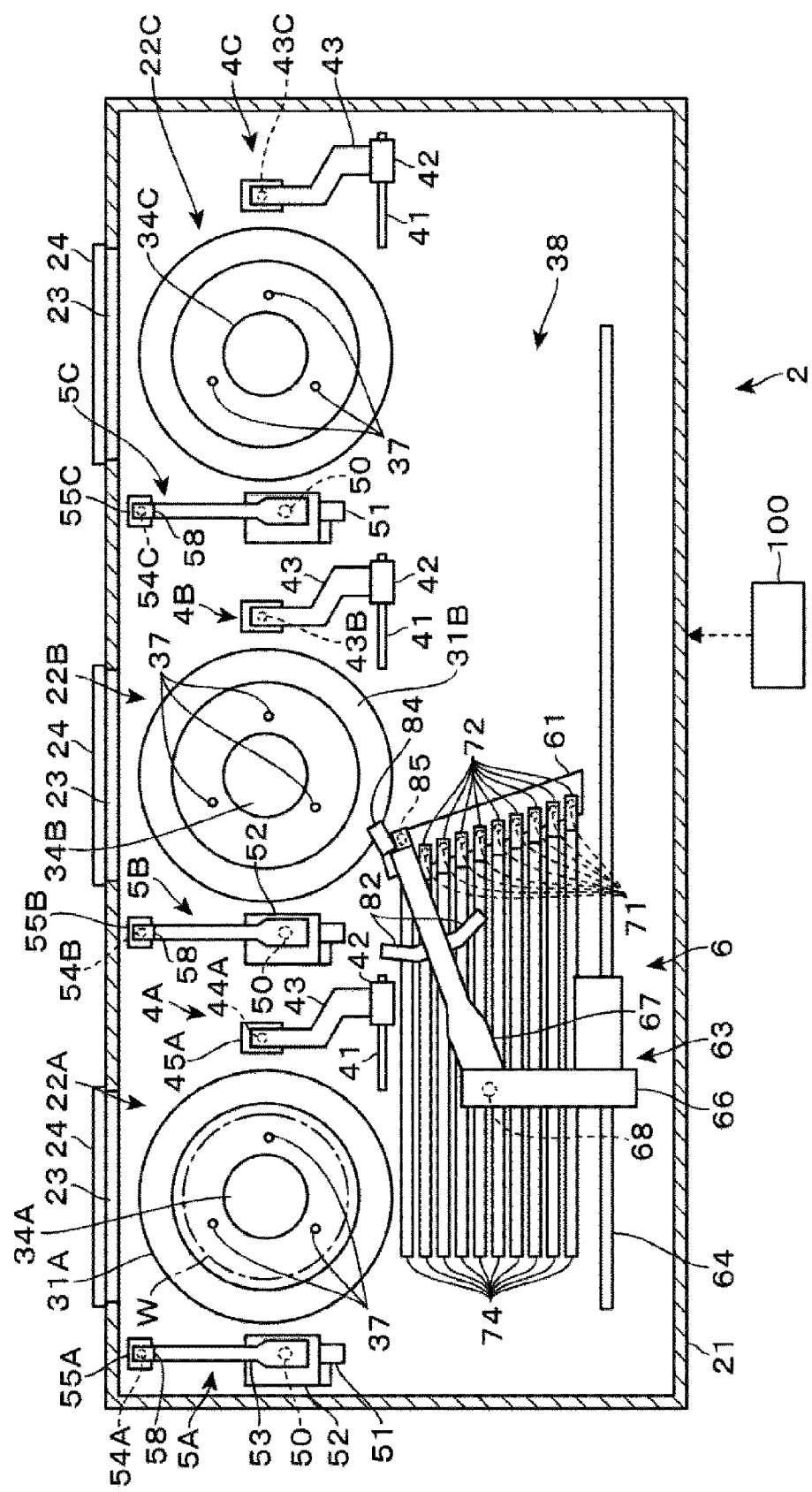
FIG. 2 is a plan view of the resist coating module.

In FIG. 2, reference numeral 23 denotes transfer ports through which wafers W are transferred to respective processing parts 22A, 22B, and 22C. The transfer ports 23 are opened at positions corresponding to respective processing parts 22A, 22B, and 22C on a front sidewall of the housing 21. The transfer ports 23 are opened and closed independently of each other by shutters 24, respectively. Hereinafter, descriptions will be made assuming that the arrangement direction of the processing parts 22 is a left-right direction, and that, unless otherwise specified, the right and left sides are respectively the right and left sides when viewed from the rear side to the front side. The processing part 22A is disposed on the left side, and the processing part 22C is disposed on the right side.

Figure 3:
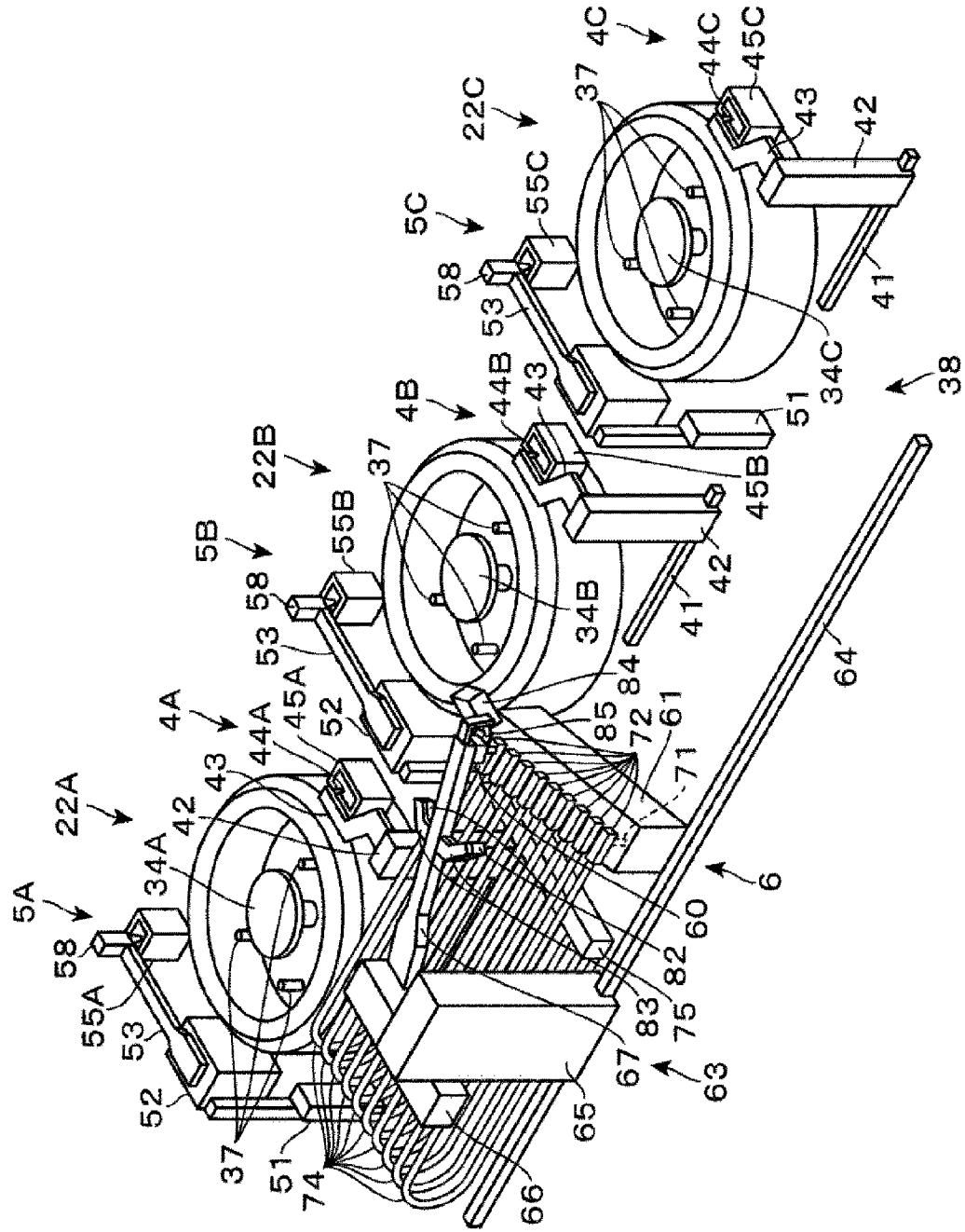
FIG. 3 is a perspective view of the resist coating module.
Figure 4:
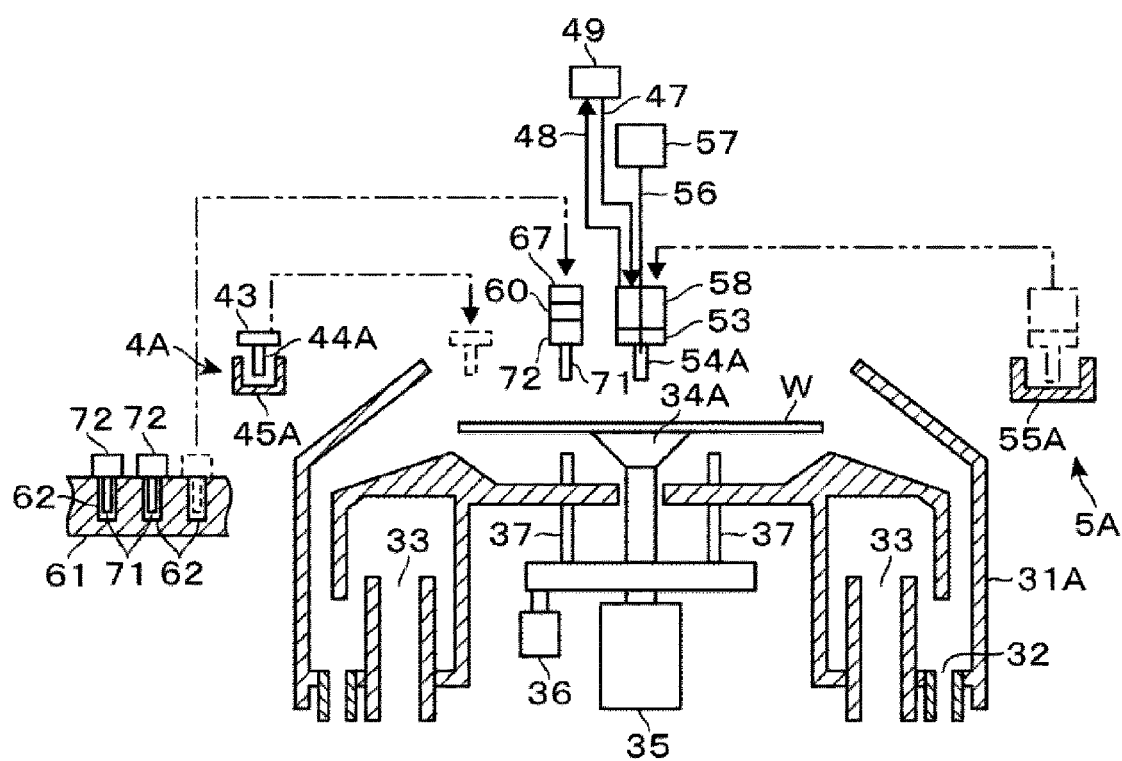
FIG. 4 is a vertical cross-sectional side view of a cup provided in the resist coating module.

Descriptions will be made with reference to FIG. 3, which is a perspective view of the interior of the housing 21. The processing parts 22A to 22C are configured similarly to each other. Hereinafter, as a representative example, the processing part 22A will be described with reference to a vertical cross-sectional side view of FIG. 4. The processing part 22A includes a cup 31A that is open at the top and accommodates the wafer W in an internal holding region of the processing part 22A. In FIG. 4, reference numeral 32 denotes a drain port provided in the cup 31A, and in FIG. 4, reference numeral 33 denotes an exhaust port for evacuating the interior of the cup 31A during processing of the wafer W. A spin chuck 34A, which is a substrate holder, is provided inside the cup 31A, and suctions the center of a rear surface of the wafer W so as to hold the wafer W horizontally. The lower side of the spin chuck 34A is connected to a rotation driver 35. By the rotation driver 35, the spin chuck 34A rotates around a vertical axis together with the wafer W held thereon. Inside the cup 31A, three pins 37 (only two pins are illustrated in FIG. 4), which are moved up and down by a lifting mechanism 36, are provided, and deliver the wafer W between the transfer mechanism 13 of the wafer W and the spin chuck 34A.

The processing part 22A includes a peripheral processing mechanism 4A configured to performing EBR and a processing mechanism 5A configured to perform a cleaning process. Hereinafter, the peripheral processing mechanism 4A will be described. The peripheral processing mechanism 4A includes a linear motion mechanism 41, a lifting mechanism 42, an arm 43, a nozzle (hereinafter, referred to as a peripheral nozzle) 44A, and a cup-shaped standby part 45A. The linear motion mechanism 41 is provided to extend in the left-right direction in the right region on the rear side of the cup 31A. The lifting mechanism 42 is connected to the linear motion mechanism 41. The lifting mechanism 42 is configured to be capable of linear movement horizontally in the left-right direction by the linear motion mechanism 41. The base end of the arm 43 is connected to the lifting mechanism 42, and the distal end side of the arm 43 extends forward. The arm 43 is vertically moved up and down by the lifting mechanism 42. The peripheral nozzle 44A, which is a third nozzle, is provided below a distal end of the arm 43 so as to discharge a thinner, for example, obliquely with respect to a horizontal plane and toward the rear side in a plan view. The discharge of the thinner is performed after the cleaning and the formation of the resist film, that is, when the processing liquid is not discharged from an individual nozzle 55 and a resist nozzle 71 to be described below. The peripheral nozzle 44A is connected to a thinner supply mechanism (not illustrated) configured to supply the thinner to the peripheral nozzle 44A via a pipe.

The standby part 45A, which is a third standby part, is provided in a region on the right side with respect to the center of the cup 31A in the front-rear direction. In cooperation between the linear motion mechanism 41 and the lifting mechanism 42, the peripheral nozzle 44A moves between a standby position within the standby part 45A and a thinner discharge position (a third discharge position) above the peripheral edge of the wafer W at a predetermined height from the wafer W within the cup 31A. When not used, the peripheral nozzle 44A waits at the standby position described above.

Next, a processing mechanism 5A will be described. The processing mechanism 5A includes a lifting mechanism 51, a rotation mechanism 52, an arm 53, a nozzle (hereinafter, referred to as a peripheral nozzle) 54A, and a cup-shaped standby part 55A. The lifting mechanism 51 and the rotation mechanism 52 are provided on the left side of the center of the cup 31A in the front-rear direction. The rotation mechanism 52 is connected to the lifting mechanism 51 and moves vertically up and down by the lifting mechanism 51. The base end of the arm 53 is connected to the rotation mechanism 52, and a distal end side of the arm 53 extends in a lateral direction. The rotation mechanism 52 rotates the arm 53 around a vertical rotation shaft 50 (see FIG. 2) provided on the base side of the arm 53. That is, the distal end side of the arm 53 rotates around the rotation shaft 50, and the rotation mechanism 52 constitutes a turning mechanism. The individual nozzle 54A, which is a second nozzle, is provided below the distal end of the arm 53 so as to discharge the thinner vertically downward. The downstream end of the pipe 56 is connected to the individual nozzle 54A, and the upstream end of the pipe 56 is connected to a thinner supply mechanism 57 configured to supply the thinner to the individual nozzle 54A.

A box body 58 surrounding the downstream side of the pipe 56 is provided at the distal end of the arm 53. Temperature-adjusted water is supplied to a space outside the pipe 56 within the box body 58. One end of a supply pipe 47 and one end of a discharge pipe 48 are connected to the box body 58 (see FIG. 4). The other end of the supply pipe 47 and the other end of the discharge pipe 48 are connected to a circulation flow forming mechanism 49. The circulation flow forming mechanism 49 adjusts the temperature of the water supplied from the discharge pipe 48, and supplies the water to the space within the box body 58 via the supply pipe 47. That is, the circulation flow forming mechanism 49 constitutes a chiller, and the temperature of the thinner passing through the pipe 56 is adjusted by the supply of the temperature-adjusted water. That is, the temperature of the thinner discharged from the individual nozzle 54A is adjusted.

On the left side of the cup 31A, the standby portion 55A, which is a first standby part, is provided in a region closer to the front side than the center of the cup 31A in the front-rear direction. In cooperation between the lifting mechanism 51 and the rotation mechanism 52, the individual nozzle 54A moves between a standby position within the standby part 55A and a discharge position (a second discharge position) above the center of the wafer W at a predetermined height from the wafer W within the cup 31A. When not used, the individual nozzle 54A waits at the standby position within the standby part 55 described above.

As described above, each of the processing parts 22B and 22C is configured similarly to the processing part 22A. Components of the processing parts 22B and 22C that are the same as those of the processing part 22A are denoted by the same reference numerals as those used in the processing part 22A. However, the alphabetic characters added after the numerals are indicated using different alphabetic characters among the processing parts. Letter B is additionally indicated in the reference numeral of the processing part 22B, and letter C is additionally indicated in the reference numeral of the processing part 22C. In the following description, the rear region of the cups 31A to 31C inside the housing 21 is denoted by 38.

Next, the resist supply mechanism 6 will be described. The resist supply mechanism 6 includes a standby part 61, ten resist nozzles 71, and a nozzle transfer mechanism 63. The standby part 61, which is a second standby part, is disposed behind the cup 31B. The standby part 61 is configured as a stage that extends backward and forward in the rear region 38 and has a rear side oriented to the right side in a plan view. In addition, ten recesses (see FIG. 4) are formed in the upper portion of the standby part 61 at intervals along the lengthwise direction of the stage. Each recess is configured as a standby position 62 at which the resist nozzle 71 is accommodated and stands by. By supplying a thinner to each standby position 62, it is possible to prevent drying of the resist in the resist nozzle 71 during standby.

The reason why the standby part 61 is provided behind the central cup 31B among the cups 31A to 31C as described above is to prevent a large difference in distances between the standby part 61 and the processing parts when the resist nozzles 71 are transferred onto the wafers W from the standby part 61. More specifically, by suppressing the difference in the distances, the tension applied to the pipes 74 connected to the resist nozzles 71 to be described later is prevented from varying for each process in each processing part 22. Thus, the variation in the state of the liquid flow discharged between the processes in each processing part 22 is suppressed.

The resist is discharged vertically downward from each of the resist nozzles 71, which are the second nozzles shared by each of the processing parts 22. As will be described later, the resist nozzles 71 are configured to have visible-light translucency for capturing internal images of the resist nozzles 71. Block-shaped held portions 72, held by the nozzle transfer mechanism 63 to be described later, are provided on the resist nozzles 71, respectively. In addition, one end of a flexible pipe 74 is connected to each resist nozzle 71 from the left side. The upstream side of each pipe 74 is curved to be directed downward and then directed rightward, and a portion extending rightward is fixed to the floor. Reference numeral 75 in FIG. 3 denotes a fixing portion for performing the fixing. A resist supply mechanism (not illustrated) is connected to the upstream side of each pipe 74. The resist supply mechanism is provided for each pipe 74. The resist supply mechanisms supply different types of resists to the resist nozzles 71 via the pipes 74, respectively.

Next, the nozzle transfer mechanism 63, which is a driver of the second nozzles, will be described. The nozzle transfer mechanism 63 includes a linear motion mechanism 64, a lifting mechanism 65, a lifting part 66, and an arm (hereinafter, referred to as a "shared arm") 67 extending in the horizontal direction. The linear motion mechanism 64 is provided so as to extend in the left-right direction on the rear side of the standby part 61. The linear motion mechanism 64 is provided with the lifting mechanism 65. The lifting mechanism 65 is configured to be movable left and right by the linear motion mechanism 64. The base end of the lifting part 66 extending back and forth is connected to the lifting mechanism 65. The base end of the shared arm 67 is provided at the distal end of the lifting part 66. A vertical rotation shaft 68 (see FIG. 2) is provided at the base end of the shared arm 67. The shared arm 67 is rotated around the rotation shaft 68 by a rotation mechanism (not illustrated). That is, the distal end side of the shared arm 67 swivels about the rotation shaft 68.

An attachment/detachment mechanism 60 for attaching/detaching the held portions 72 of the resist nozzles 71 is provided below the distal end of the shared arm 67, so that the resist nozzle 71 can be freely changed in the standby part 61. For example, a concave portion is formed, for example, in each of the upper portions of the held portions 72, and the above-mentioned attachment/detachment mechanism is configured as a protrusion that enters the concave portion. For example, a small protrusion is provided on the side surface of the protrusion, and thus the attachment/detachment is performed when the small protrusion is protruded and retracted so as to switch between an engagement state in which the small protrusion is engaged with the side surface of the concave portion and a release state in which the engagement is released.

In cooperation between the linear motion mechanism 64, the lifting mechanism 65, and the shared arm 67, each of the resist nozzles 71 may move between a standby position in the standby part 61 and a discharge position (a second discharge position) at a predetermined height from the front surface of the wafer W within each of the cups 31 (31A to 31C) and above the center of each wafer. When the resist nozzles 71 are transferred onto the wafer W, the resist nozzles 71 are transferred by rotating the shared arm 67 clockwise in a plan view from the state in which the distal end thereof extends leftwards with respect to the base end thereof in the state in which the lifting mechanism 65 is stopped at a position corresponding to each of the processing parts 22A to 22C. In addition, in transferring the resist nozzles 71 between the standby part 61 and the processing parts 22 and between the processing parts 22, when the lifting mechanism 65 is moved left and right by the linear motion mechanism 64, the shared arm 67 is oriented such that the distal end thereof is directed toward the right side and located in the rear region 38. That is, the shared arm 67 moves so as not to hinder the processing in each processing part 22.

Figure 5A:
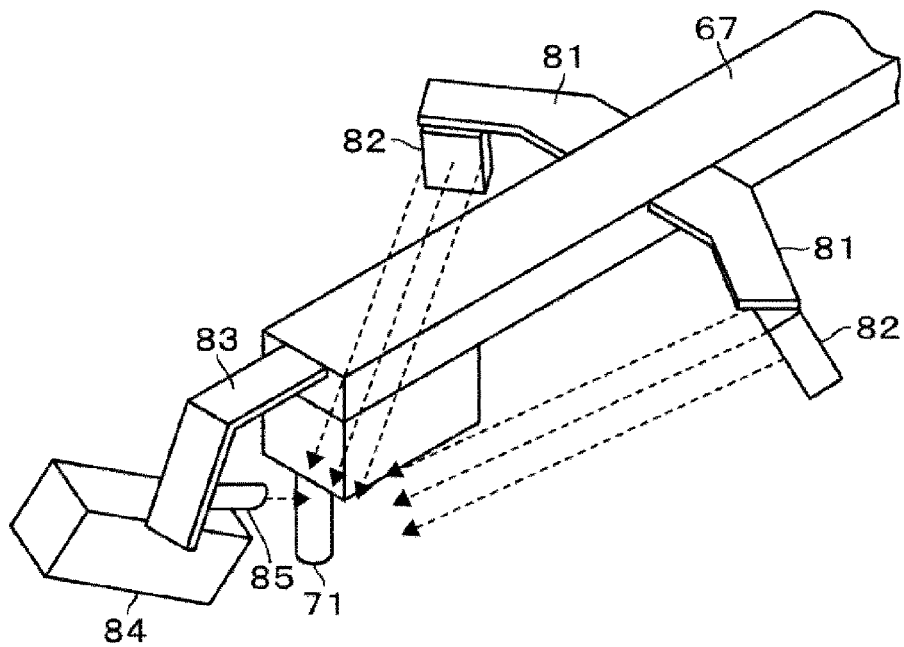
FIG. 5A is a perspective view of a shared arm constituting the resist coating module.
Figure 5B:
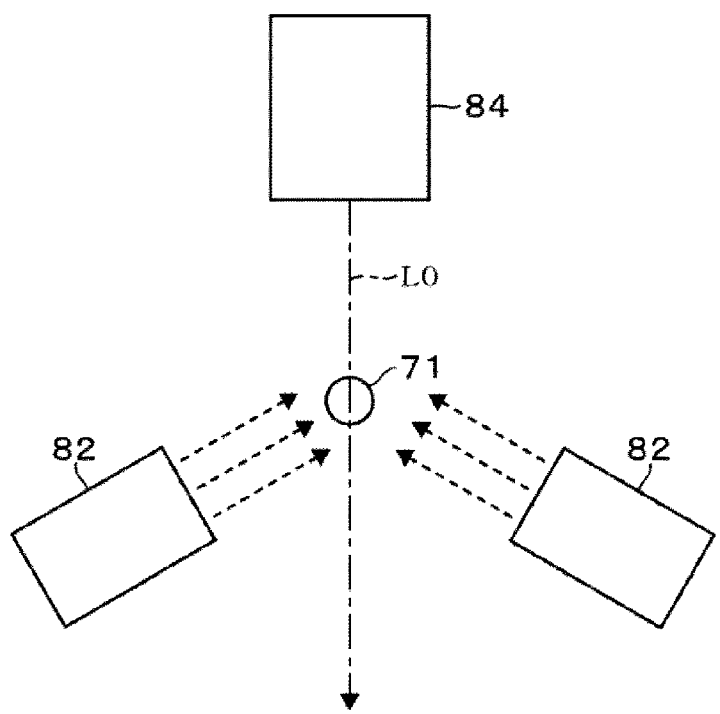
FIG. 5B is a top view illustrating a positional relationship between components provided on the shared arm.

The above-described shared arm 67 will be described with reference to FIG. 5A which is a perspective view on the distal end side and FIG. 5B which is a schematic top view. On the base side of the shared arm 67, support portions 81 are provided to extend to the left and right when viewed in the direction in which the shared arm 67 extends. The left and right do not always coincide with the left and right in the longitudinal direction of the housing 21 described above. A first illumination 82, which is a light-emitting diode (LED), is provided at a distal end of each support portion 81. Each first illumination 82 may have a plane that emits light in a relatively wide range, and may emit light toward the resist nozzle 71 held by the shared arm 67. Since the first illuminations 82 are provided apart from each other, light is emitted to the resist nozzle 71 in different directions. More specifically, in a plan view, light is emitted toward the resist nozzle 71 from each of two regions separated by a straight line L0 connecting a camera 84 (to be described later) and the resist nozzle 71 (indicated by a dotted arrow in FIG. 5B). Specifically, the straight line connecting the camera 84 and the resist nozzle 71 is, for example, an optical axis of the camera 84, and is a straight line including an extension of the straight line between the camera 84 and the resist nozzle 71, in addition to the straight line between the camera 84 and the resist nozzle 71. The reason that the light is emitted in the different directions is to equally recognize both of left and right sides of the inner wall of the resist nozzle 71 in order to specify the range of the liquid existing in the resist nozzle 71 in an image acquired by the camera 84 to be described later. That is, when the liquid is present in the resist nozzle 71, on the inner wall of the resist nozzle 71, a bright and dark contrast is generated between a portion that is in contact with the liquid and a portion that is not in contact with the liquid, so that the two portions can be distinguished. Therefore, even if it is not possible to clearly specify the upper and lower surfaces of the liquid in the image, the above-mentioned contrast makes it possible to specify the range in which the liquid is present from the range of the inner wall, which is in contact with the liquid. Further, by equally recognizing the inner wall on both of the left and right sides of the liquid, it is possible to specify the existing range of the liquid with higher reliability.

Figure 6:
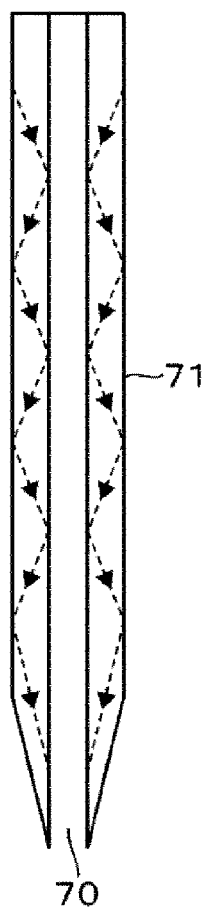
FIG. 6 is a side view of a resist nozzle held by the shared arm.

In addition, a support portion 83 is provided on the distal end side of the shared arm 67. The support portion 83 is provided with the camera 84 and a second illumination 85, which is an LED. The optical axis of the camera 84 is obliquely directed downward such that the resist nozzle 71 and a region below the resist nozzle 71 are included in the field of view of the camera 84. The second illumination 85 emits light toward the base end side of the shared arm 67 and obliquely downward. This light forms a relatively small irradiation spot at the upper end of the resist nozzle 71. The arrows in FIG. 6 indicate optical paths inside the resist nozzle 71 of the light supplied from the second illumination 85 to the resist nozzle 71 as described above. As illustrated in FIG. 6, the light travels downward while being reflected between an outer peripheral surface of the flow path 70 in the resist nozzle 71 and an outer peripheral surface of the resist nozzle 71. Since the light passes through the interior of the resist nozzle 71 in this manner, a clear image of the interior of the resist nozzle 71 is obtained. In addition, as described above, since the illuminations and the cameras are provided on the shared arm 67, which is independent of a mechanism provided for each of the processing parts 22A to 22C and is shared by the respective processing parts 22A to 22C, it is possible to reduce the number of illuminations and cameras that are used and to reduce the space required for installation thereof (space saving).

For example, image capturing is performed by the camera 84, which is an image capturing part, from a time point slightly before the resist is discharged from the resist nozzle 71 and until the discharge of the resist is terminated. During this image capturing, for example, an image of the resist nozzle 71 may be acquired by simultaneously emitting light from the first illuminations 82 and the second illumination 85. Alternatively, the timing of emitting light from the first illuminations 82 and the timing of emitting light from the second illumination 85 may be shifted from each other and an image of each timing may be acquired. Image data captured by the camera 84 is transmitted to the controller 100 to be described later. Based on the acquired images, the controller 100 may detect the presence/absence of dirt attached to the resist nozzle 71, the resist dripping from the resist nozzle 71, the position of the liquid surface inside the nozzle, the presence/absence of interruption of liquid flow of the resist caused by bubbles, and the like, and may determine whether or not there is an abnormality based on the result of detection. A combination of the first illuminations 82 and the second illumination 85 constitutes an illumination part, and the second illumination 85 is configured as an upper illumination member. By providing the second illumination for emitting light from above in addition to the first illuminations 82, the upper surface and the lower surface of the liquid inside the resist nozzle 71 can be seen from the image while suppressing the image from being difficult to see due to the mist of the discharged liquid and contamination caused by scattering. In addition, the lower surface of the liquid can be recognized by illumination from above if the height thereof is small enough to stay in the nozzle.

Figure 7:
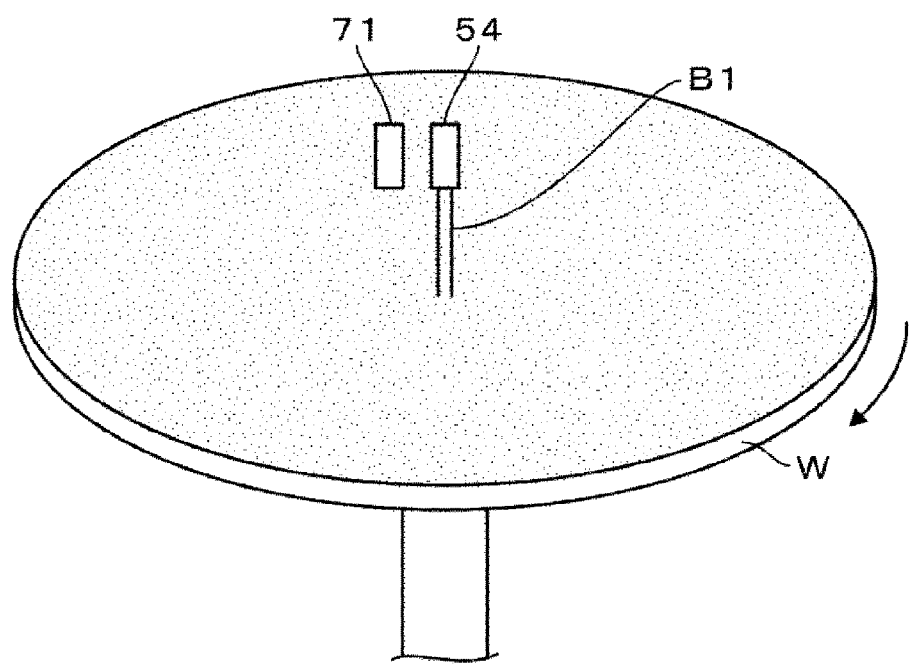
FIG. 7 is an explanatory view illustrating an operation of nozzles provided in the resist coating module.
Figure 8:
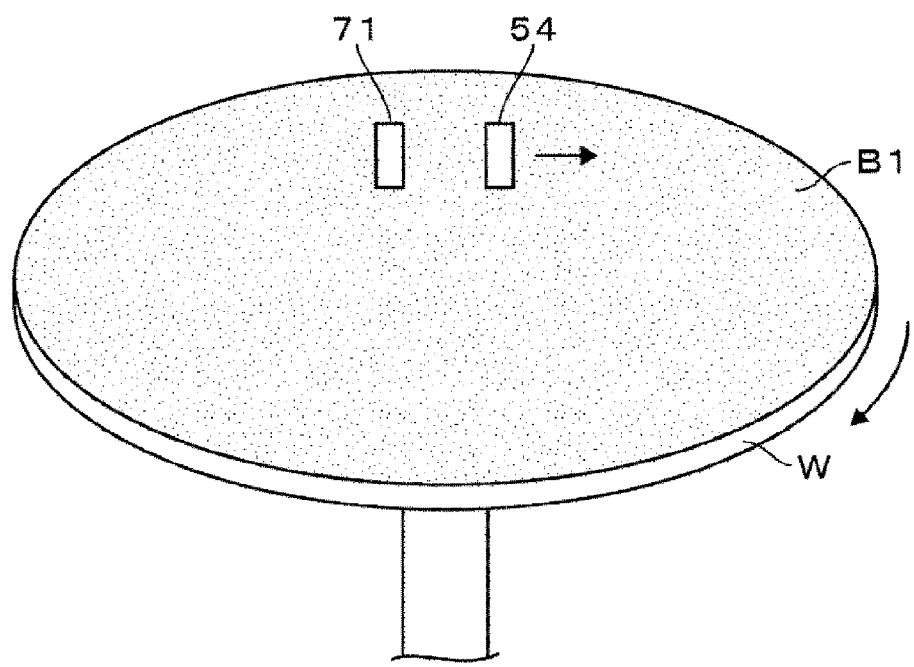
FIG. 8 is an explanatory view illustrating an operation of nozzles provided in the resist coating module.
Figure 9:
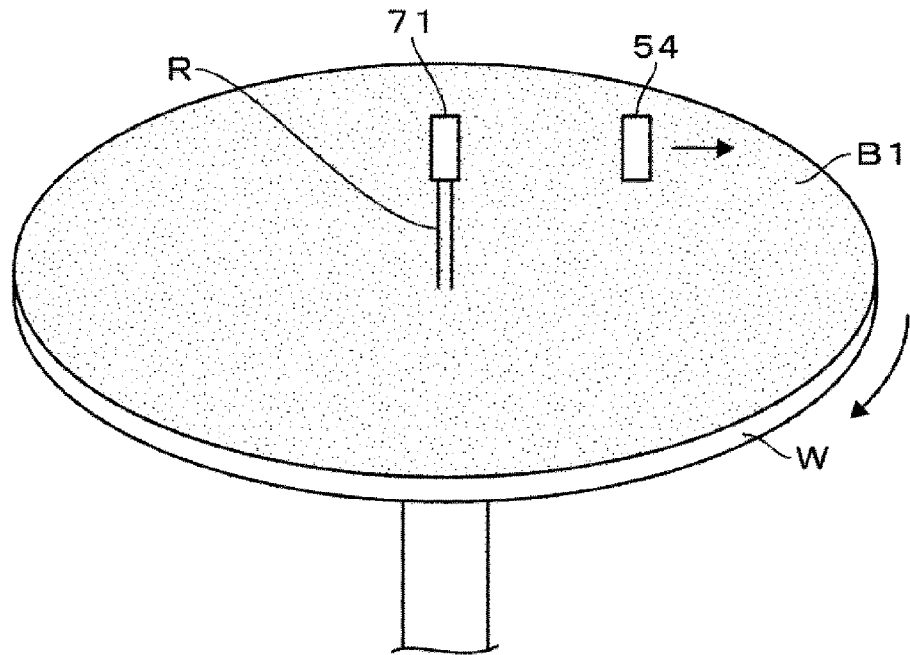
FIG. 9 is an explanatory view illustrating an operation of nozzles provided in the resist coating module.

The resist discharge position of the resist nozzle 71 and the thinner discharge position of the individual nozzle 54 (54A to 54C) are located on the center of the wafer W and become common discharge positions overlapping each other. Referring to the operation of these nozzles, in order to shorten the processing time by supplying resist R to the wafer W immediately after the cleaning of the wafer W, while the individual nozzle 54 is discharging thinner B1 onto the wafer W, the resist nozzle 71 waits at an immediately-previous standby position, which is slightly shifted in the horizontal direction from the discharge position of the resist R (FIG. 7). When the individual nozzle 54 terminates the discharge of the thinner B1 and is moved and retracted in the horizontal direction from the discharge position of the thinner B (FIG. 8), in order to avoid interference between the nozzles, the resist nozzle 71 moves in the horizontal direction slightly after this movement and stops at the discharge position of the resist R. That is, the lifting mechanism 65 does not move up and down, and only by the turning operation of the shared arm 67, the resist nozzle 71 moves from the immediately-previous standby position to the discharge position, and the discharge of the resist R is started (FIG. 9).

Figure 10:
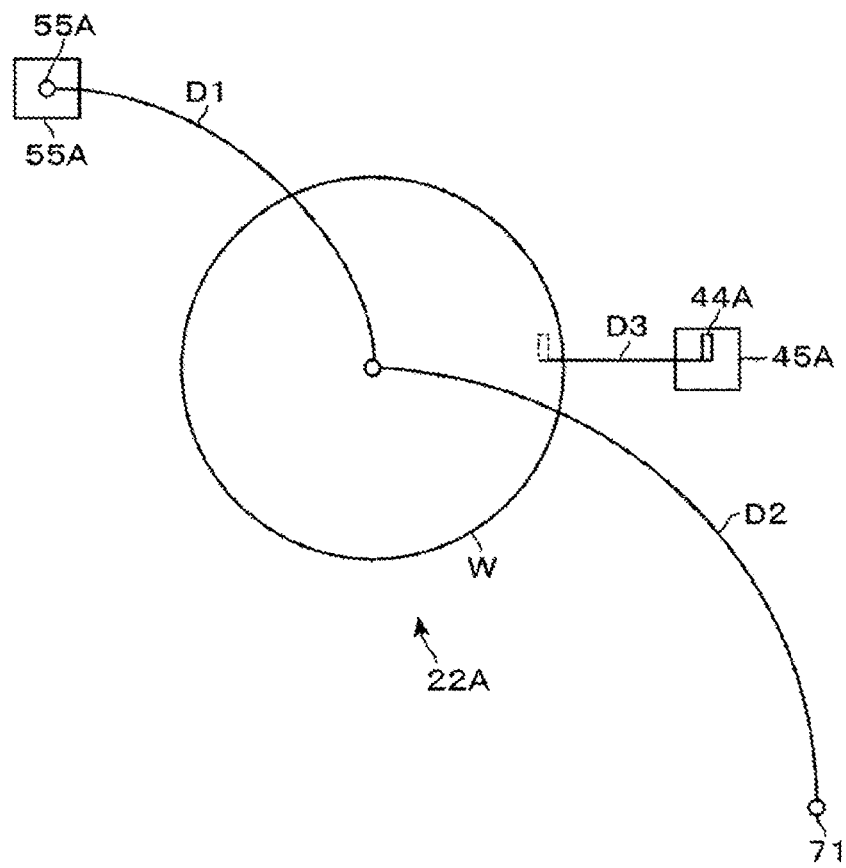
FIG. 10 is a top view illustrating a trajectory of each nozzle provided in the resist coating module.

It is assumed that the movement trajectory of the individual nozzle 54A, the movement trajectory of the resist nozzle 71, and the movement trajectory of the peripheral nozzle 44A when processing the wafer W in the processing part 22A are D1, D2, and D3, respectively. In FIG. 10, for the sake of convenience in illustration, the movement trajectory of the discharge port of each nozzle is indicated by a straight line or a curve. As described above, since the discharge position of the resist nozzle 71 and the discharge position of the individual nozzle 54A overlap, the movement trajectory D1 and the movement trajectory D2 overlap on the center of the wafer W. However, the movement trajectories D1, D2, and D3 do not overlap each other except for the overlapping of the movement trajectories on the center of the wafer W. Since the movement trajectories D1 and D2 are set in this way, the immediately-previous standby position of the resist nozzle 71 described above is a position that does not overlap the movement trajectory D1 of the individual nozzle 54A.

As the overlap of the movement trajectories D1 to D3 increases, it is necessary to set the operation order and timing of each nozzle in detail in order to prevent interference between the nozzles. That is, the movement control of each nozzle becomes complicated. However, as described above, the movement trajectories D1 to D3 do not overlap except for the overlapping of the movement trajectories D1 and D2 at the center of the wafer W. Since the overlapping of the movement trajectories D1 to D3 is suppressed as described above, the movement control of each nozzle is suppressed from being complicated. Although the movement trajectory of each nozzle when processing the wafer W using the processing part 22A is illustrated as a representative example, each nozzle also draws the same movement trajectory when another processing part 22 processes a wafer W. That is, in the processing parts 22B and 22C, the movement trajectories of the nozzles do not overlap each other in a plan view, except for the center of the wafer W. The thinner discharge position of the peripheral nozzle 44 of each processing part 22 may be any position on the wafer W. The expression "on the wafer W" means above the wafer W, and is not limited to overlapping the wafer W in a plan view as illustrated in each figure.

However, the thinner discharge position of each individual nozzle 54 (54A to 54C) is located on the center of the wafer W as described above. Accordingly, the distance between the standby portion 55 (55A to 55C) of the individual nozzle 54 (54A to 54C) provided outside the cup 31 (31A to 31C) and the discharge position in a plan view is relatively long. Therefore, when the movement between the standby portion 55 of the individual nozzle 54 and the discharge position performed via the arm 53 is performed by a linear motion mechanism which moves the peripheral nozzle 44 (44A to 44C), instead of the rotation mechanism 52, the length of the linear motion mechanism may increase. That is, in order to install the linear motion mechanism on the lateral side of the cup 31, a large space is required in the lateral direction. When the individual nozzle 54 is moved by the linear motion mechanism as described above, it may be considered that the space may be unnecessary by disposing the linear motion mechanism above the cup 31. In such a configuration, particles generated from the linear motion mechanism may fall and adhere to the wafer W. Thus, such an arrangement is not desirable. Therefore, in order to prevent the resist coating module 2 from increasing in size, it is effective that the movement of the individual nozzle 54 in the lateral direction is performed by the rotation mechanism 52 as described above.

Meanwhile, the discharge position of the peripheral nozzle 44 is located on the peripheral edge portion of the wafer W. Accordingly, since the distance between the standby portion 45 (45A to 45C) of the peripheral nozzle 44 provided outside the cup 31 and the discharge position in a plan view is relatively short, the length of the linear motion mechanism 41 is relatively small even in the configuration in which the peripheral nozzle 44 is moved by the linear motion mechanism 41 as described above. In addition, the resist film on the peripheral edge portion of the wafer W is removed in a ring shape through EBR using the peripheral nozzle 44, and it is assumed that the setting of the removal width of the resist film has been changed. As described above, the peripheral nozzle 44 is provided on the arm 43 in an inclined state. However, when the peripheral nozzle 44 is horizontally moved linearly by the linear motion mechanism 41, the thinner discharge direction with respect to the rotation direction of the wafer W is not changed even if the setting of the removal width has been changed as described above.

However, assuming that the movement of the peripheral nozzle 44 via the arm 43 is performed by the rotation mechanism that moves the individual nozzle 44 instead of the linear motion mechanism 41, the thinner discharge direction with respect to the rotation direction of the wafer W is changed by changing the setting of the removal width. In other words, in addition to the fact that the liquid landing position of the thinner changes in the radial direction of the wafer W, the change in the discharge direction may cause a large change in the centrifugal force at the liquid landing position, and the liquid splashing from the liquid landing position may increase. Therefore, it may be considered that it is necessary to adjust the inclination of the peripheral nozzle 44 each time the setting of the removal width is changed. Therefore, from the viewpoint of suppressing the trouble of such adjustment, it is preferable that the peripheral nozzle 44 be moved by the above-described linear motion mechanism 41.

Since the arm 53 supporting the individual nozzle 54 is turned by the rotation mechanism 52, the region required for the movement of the arm 53 (the turning region of the arm 53) is relatively large. It is assumed that the standby part 55 of the individual nozzle 54 and the rotation mechanism 52 are disposed on the right side of the cup 31 similarly to the standby part 45 of the peripheral nozzle 44. In this case, since the region required for the movement of the arm 53 is large as described above, it is necessary to secure a space for avoiding interference between the peripheral nozzle 44 and the arm 43 supporting the peripheral nozzle 44, and thus there is a concern that the module may be increased in size.

When both the standby part 55 of the individual nozzle 54 and the rotation mechanism 52 are disposed behind the cup 31, it will be necessary to secure the space for avoiding interference with the resist nozzle 71 and the shared arm 67 supporting the resist nozzle 71. Therefore, there is a possibility that the module is also increased in size. In addition, it is assumed that both the standby part 55 of the individual nozzle 54 and the rotation mechanism 52 are disposed in front of the cup 31. In this case, it is necessary to make the arm 53 stand by at a high position such that the arm 53 does not to interfere with the wafer W loaded into and unloaded from the processing part 22 via the transfer port 23. Thus, there is a concern that the height of the module increases and the module is also enlarged.

However, in the resist coating module 2, the standby part 55 of the individual nozzle 54 and the rotation mechanism 52 are disposed on one of the left and right sides of the cup 31, and the standby part 45 of the peripheral nozzle 44 is disposed on the other of the left and right sides. By adopting such a layout, it is possible to prevent interference between the components of the module, such as respective arms and nozzles as described above, and interference between the components of the module and the wafer W. As a result, it is possible to prevent the module from being bulky, which is preferable.

In the resist coating module 2, as described above, with respect to the rotation mechanism 52 of the individual nozzle 54 and the standby part 55 provided on the lateral side of the cup 31, the rotation mechanism 52 is located on the rear side and the standby part 55 is located on the front side. With such an arrangement, as illustrated in FIGS. 7 to 9, the resist nozzle 71 may be moved to the discharge position from the side opposite the side on which the individual nozzle 54A is caused to be retracted from the discharge position. Accordingly, when the individual nozzle 54 and the resist nozzle 71 are moved in this manner, interference between the nozzles does not occur, and after the discharge of the thinner by the individual nozzle 54, the resist nozzle 71 can be promptly disposed at the discharge position to start the discharge of the resist. Thus, the throughput can be improved.

Next, the controller 100 (see FIG. 2) constituting the resist coating module 2 will be described. The controller 100 is configured by a computer. The controller 100 has a program storage part (not illustrated). The program storage part stores a program in which instructions (a step group) are set such that the resist coating module 2 operates as described above and as will be described later and a process is performed in each processing part 22. Such operations are performed by outputting control signals from the controller 100 to each part of the resist coating module 2 by the program. The above-described program is stored in the program storage part in the state of being stored in a storage medium such as a hard disc, a compact disc, a magneto-optical disc, a memory card, a DVD or the like.

In the resist coating module 2, for example, the wafers W may be repeatedly loaded into the processing parts 22A, 22B, and 22C in that order by the above-described transfer mechanism 13. A series of processes including cleaning of the wafers W, formation of a resist film, and EBR, are performed in each processing part 22. When an unload signal for the wafer W is output from the temperature adjustment module 12, the above program sets a processing schedule for the wafer W (scheduled operations of each part of the module for performing the processes on the wafer W). Then, the program outputs the above control signals such that the series of processes are performed based on the set processing schedule.

Figure 11:
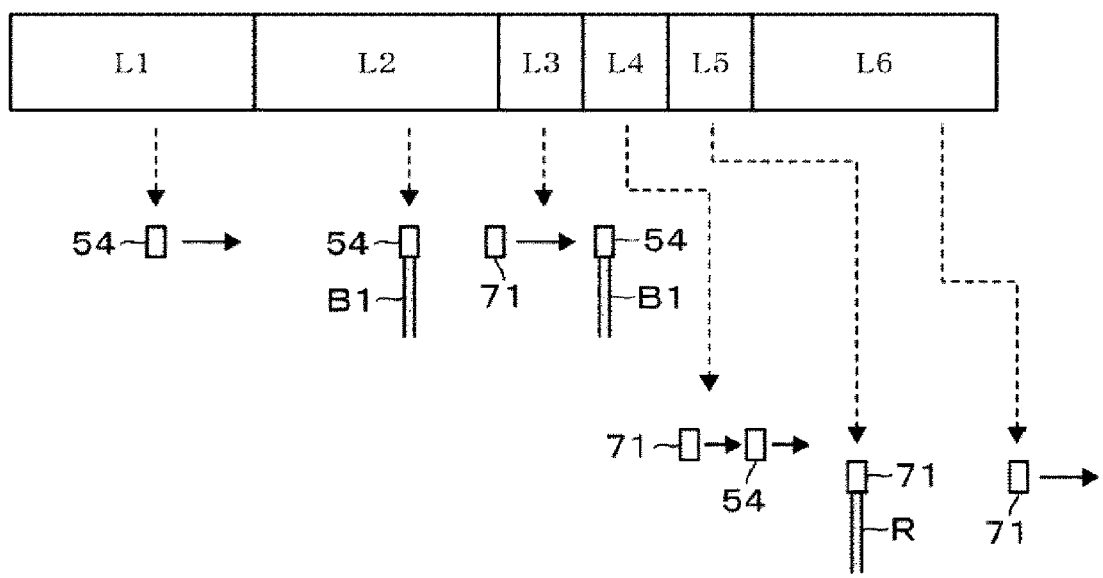
FIG. 11 is a chart illustrating an operation of the resist coating module.

FIG. 11 is a time chart showing operation timing of the individual nozzle 54 and the resist nozzle 71 in the processing schedule set as described above. Hereinafter, each operation process in continuous periods L1 to L6 shown in this time chart will be described. The wafer W is rotating at a predetermined number of rotations during these periods L1 to L6. The start point of the period L1 is the start point of the series of processes described above. In this period L1, the individual nozzle 54 is moved from the standby part 55 to the discharge position. In the period L2, thinner B1 is discharged onto the rotating wafer W from the individual nozzle 54 moved to the discharge position.

In the period L3, the resist nozzle 71 moves from the rear region 38 to the immediately-previous standby position of the wafer W described with reference to FIG. 8. As will be specifically described later, the movement to the immediately-previous standby position of the wafer W includes a case where the resist nozzle 71 moves from the standby part 61 and the case where the resist nozzle 71 that has terminated processing of another wafer W moves to the standby part 61 from the outside. The discharge of the thinner B1 is continuously performed. At the start point of the period L4, the discharge of the thinner B1 is stopped. During the period L4, retraction of the individual nozzle 54 from the discharge position and movement of the resist nozzle 71 to the discharge position are sequentially performed as described with reference to FIGS. 8 and 9. Then, the individual nozzle 54, which was retracted from the discharge position, moves toward the standby part 55.

In the period L5, the resist R is discharged from the resist nozzle 71 at the discharge position. Then, at the start point of the period L6, the discharge of the resist R stops, and the resist nozzle 71 is retracted to the rear region 38. Regarding the retraction of the resist nozzle 71 to the rear region 38, there are the case where the resist nozzle 71 is returned to the standby position of the standby part 61 and the case where the resist nozzle 71 is not returned to the standby position, depending on the transfer state of the subsequent wafer W as described later. The controller 100 constitutes a determination mechanism configured to determine the transfer path of the resist nozzle 71. In this example, since the discharge time of the cleaning thinner is longer than the discharge time of the resist, the period L2+L3 is larger than the period L5. Since the same process is performed on each wafer W, the lengths of the periods L1 to L6 in the processes of respective substrates are the same. The process from the start of the period L1 in which the individual nozzle 54 starts moving from the standby part 44 to the end of the period L5 in which the discharge of the resist from the resist nozzle 71 is terminated may be referred to as a continuous process.

When the transfer interval of wafers W to the resist coating module 2 is relatively short, processing schedules of other processing parts 22 are set such that, in parallel with a series of processes in one processing part 22 to which a wafer W has been previously transferred, a series of processes is performed in another processing part 22 to which the next wafer W is transferred. More specifically, the processing schedule is set such that the periods during which the above-described continuous processes are performed between the processing parts 22 overlap.

As described above, the resist coating module 2 has a configuration in which the resist nozzle 71 and the shared arm 67 are shared by the respective processing parts 22. Therefore, the processing schedule of another processing part 22 is set such that while one of the processing parts 22 is using the resist nozzle 71 and the shared arm 67, a process in which the resist nozzle 71 and the shared arm 67 are not used is performed in another processing part 22. That is, based on the processing schedule of one processing part 22 set earlier, the processing schedule of another processing part 22 is set.

Setting of the processing schedule of another processing part 22 will be described in more detail with reference to FIG. 12. It is assumed that the end time of the period L6 at which the operation of the resist nozzle 71 and the shared arm 67 is terminated in one processing part 22 is t1, and the start time of the period L3 at which the operation of the resist nozzle 71 and the shared arm 67 starts in another processing part 22 is t2. The processing schedule of another processing part 22 is set such that the time after the above-mentioned time t1 becomes the above-mentioned time t2, and an interval A1 between the time t1 and the time t2 is set to be the shortest length within the range of a set time or more. In addition, the set time is, for example, a time longer than 0 seconds.

That is, as a wafer transfer interval from the transfer of a wafer W (a first substrate) to one processing part 22 until the transfer of a wafer W (a second substrate) to another processing part 22 becomes shorter, the interval A1 becomes shorter, and the time during which the wafers W are processed in parallel in the one processing part 22 and another processing part 22 becomes longer. However, the interval A1 is not set to be shorter than the set time. As the transfer interval becomes longer, the interval A1 becomes longer. Depending on the transfer interval, processes are not performed in parallel between the processing parts 22, and after a series of processing is terminated in one processing part 22, a series of processes is started in another processing part 22.

Since the wafers W are processed in respective processing parts 22 in the same manner, setting the interval A1 in this manner also means setting the start interval of processing of the wafers W between the processing parts 22. When the unload signal is output from the temperature adjustment module 12 as described above, a processing schedule is set. Meanwhile, it is assumed that after the processing is started by one processing part 22, a next unload signal is generated at a short interval. In this case, since the interval A1 is set as described above, the start timing of the period L1 in the another processing part 22 is set so as to go back a predetermined time A2 from the termination timing of the period L5 at which the resist discharge process is terminated in the one processing part 22. That is, during the processing of a wafer W in one processing part 22, depending on the timing at which the resist discharge process on the wafer W is to be terminated (the timing at which the continuous process is to be terminated), the timing at which the continuous process of a wafer W is to be started in another processing part 22 is determined.

Figure 12:
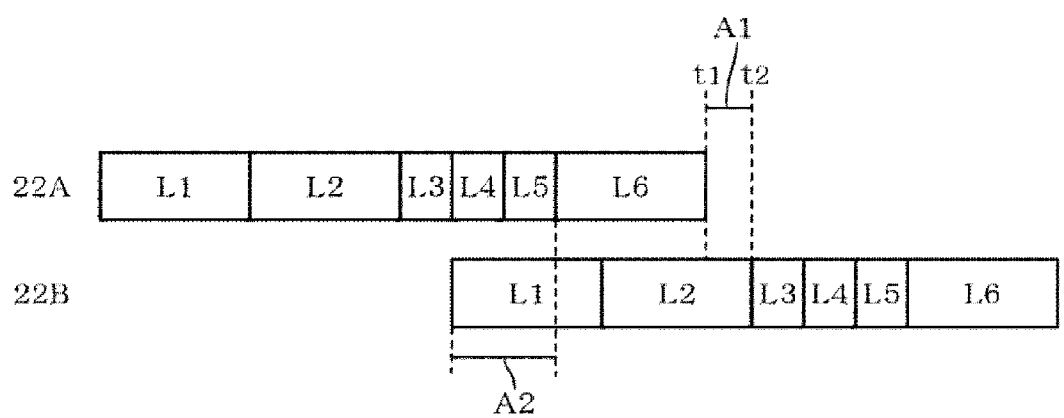
FIG. 12 is a chart illustrating an operation of the resist coating module.

In FIG. 12, there is shown a time chart showing the periods L1 to L6 when the processing schedule in the processing part 22B is set assuming that one processing part 22 is the processing part 22A and another processing part 22 is the processing part 22B. In this example, the interval A1 is set to be the set time, that is, the minimum time. Setting the set time of the interval A1 to a time longer than 0 seconds enables the process in another processing part 22 to be performed without any inconvenience even if the actual process in one processing part 22 is delayed with respect to the processing schedule. In addition, the transfer mechanism 13 operates such that the wafers W for which the processing schedule in the processing parts 22 is set as described above are transferred from the temperature adjustment module 12 according to the start timing of the processing schedule. Then, after the transfer of the wafers W to the processing parts 22, the processes are started immediately based on the processing schedule.

By setting the processing schedule as described above, the period from the end of the discharge of the thinner to the start of the discharge of the resist in each processing part 22 has a preset length. If this period is too long, the thinner may volatilize from the wafer W, and if this period is too short, the resist nozzle 71 may not move to the discharge position in time. That is, the processing schedule in each processing part 22 is set such that the above mentioned problems do not occur. That is, the start timing of the series of processes in another processing 22 is determined such that the time from the end of the discharge of the thinner to the start of the discharge of the thinner in the one processing part 22 is not delayed.

The operation in the period L6 in the time charts of FIGS. 11 and 12 will be additionally described. It is assumed that at a predetermined timing during the processing of the wafer W according to the processing schedule, for example, at the start of the period L6, the processing schedule of the next wafer W has not been set, that is, there is no transfer schedule of the next wafer W to the resist coating module 2. In this case, the resist nozzle 71, which has been held by the shared arm 67 and has discharged the resist to the wafer W, is transferred to the standby position 62 in the standby part 61. This prevents the resist from drying within the resist nozzle 71. Meanwhile, when the processing schedule for the next wafer W has been set at the start of the period L6, the resist nozzle 71 held by the shared arm 67 is located, for example, above the standby position 62 rather than being transferred to the standby position 62. As described above, when the transfer interval of the wafer W to the processing part 22 is short and the resist discharge interval is short, the drying in the resist nozzle 71 is unlikely to occur. In this case, the operation of raising and lowering the resist nozzle 71, required for the movement to the standby position 62 and the movement from the standby position 62, may be omitted. As a result, it is possible to improve throughput. In addition, as described above, since the movement destinations of the resist nozzle 71 in the period L6 are different, the movement origins of the resist nozzle 71 in the period L3 are made different.

Hereinafter, an operation example of the resist coating module 2 that sequentially transfers the wafers W to the processing parts 22A to 22C to perform processes from the state where no wafer W has been transferred to the processing parts 22A to 22C will be described. As described above, in practice, the wafers W are repeatedly transferred to the processing parts 22A to 22C. However, here, for the sake of avoiding complexity of description, it is assumed that only three wafers W of the same lot are continuously transferred to the resist coating module 2. These wafers W are denoted by W1, W2, and W3 in the order of loading into the resist coating module 2. Further, in this description, it is assumed that each of the wafers W1 to W3 can be unloaded from the temperature adjustment module 12 at a relatively short interval, and that the interval A1 described in FIG. 12 is the minimum.

Figure 13:
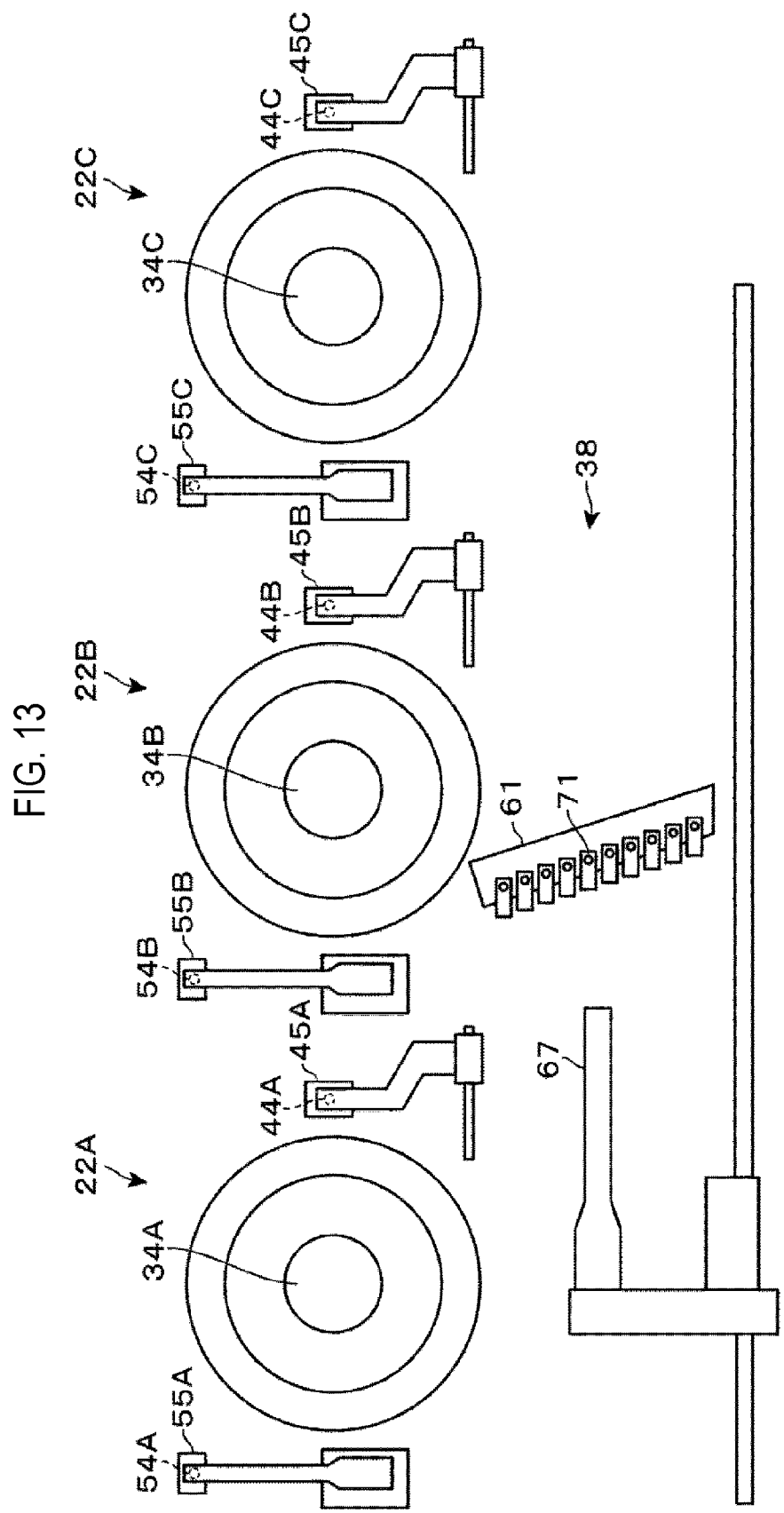
FIG. 13 is an operational view illustrating the operation of the resist coating module.

In the state in which the peripheral nozzle 44, the individual nozzle 54, and the resist nozzle 71 are kept in standby at each of standby parts (FIG. 13), an unload signal of the wafer W1 is output from the temperature adjustment module 12, and a processing schedule in the processing part 22A is set. Then, the wafer W1 is transferred to the processing part 22A where the wafer W1 is held and rotated by the spin chuck 34A, and a process is started according to the processing schedule. That is, the movement of the individual nozzle 54A from the standby part 55 to the discharge position and the discharge of the thinner B1 from the individual nozzle 54A to the center of the wafer W1, which are described as the operations in the periods L1 and L2 in the charts of FIGS. 11 and 12, are sequentially performed. By a centrifugal force, the thinner B1 is spread over the entire front surface of the wafer W1 to clean the front surface of the wafer W1.

Figure 14:
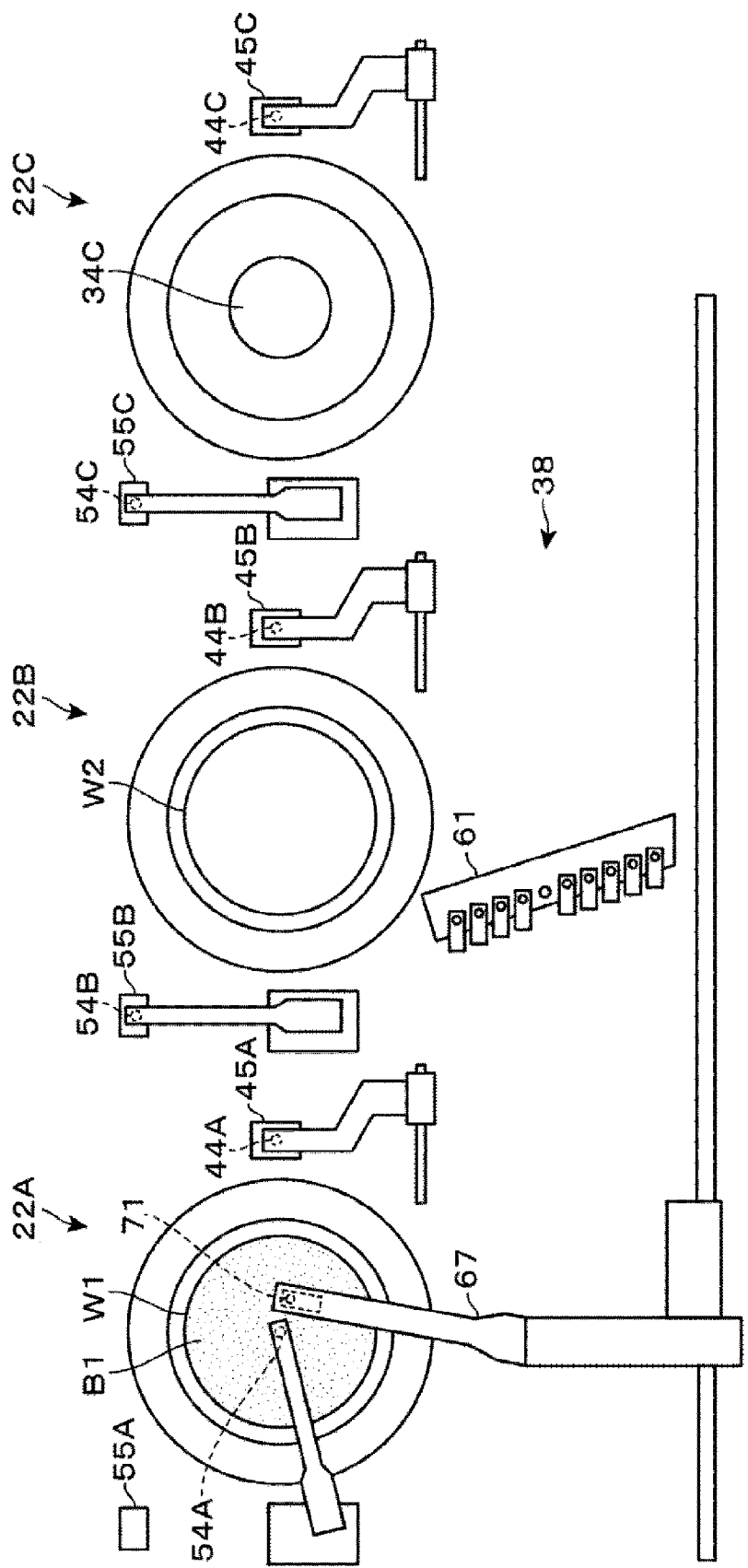
FIG. 14 is an operational view illustrating the operation of the resist coating module.

While the process is being performed in the processing part 22A in this manner, an unload signal of the wafer W2 is output from the temperature adjustment module 12, and a processing schedule in the processing part 22B is set. Then, the operation in the period L3 is performed in the processing part 22A. That is, the shared arm 67 holds one resist nozzle 71 and transfers the resist nozzle 71 to the immediately-previous position of the wafer W1. Meanwhile, the wafer W2 is transferred to the processing part 22B where the wafer W is held and rotated by the spin chuck 34B (FIG. 14). Thereafter, in the processing part 22A, as the operation in the period L4, the movement of the individual nozzle 54 from the discharge position to the standby part 55 and the movement of the resist nozzle 71 to the discharge position are sequentially performed. Meanwhile, a process is started in the processing part 22B according to the processing schedule, and the movement of the individual nozzle 54B from the standby part 55B to the discharge position, which is an operation in the period L1, is performed.

Figure 15:
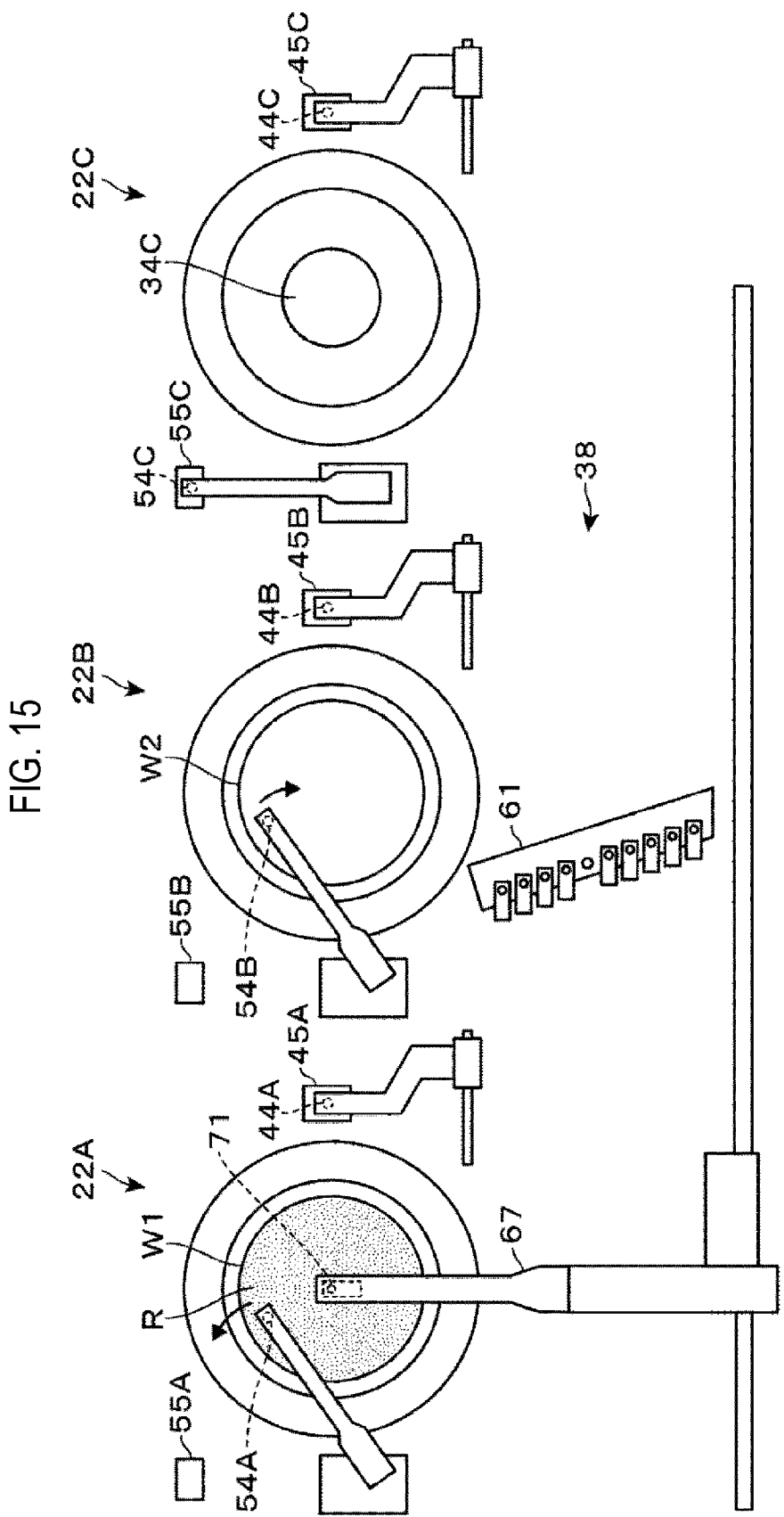
FIG. 15 is an operational view illustrating the operation of the resist coating module.
Figure 16:
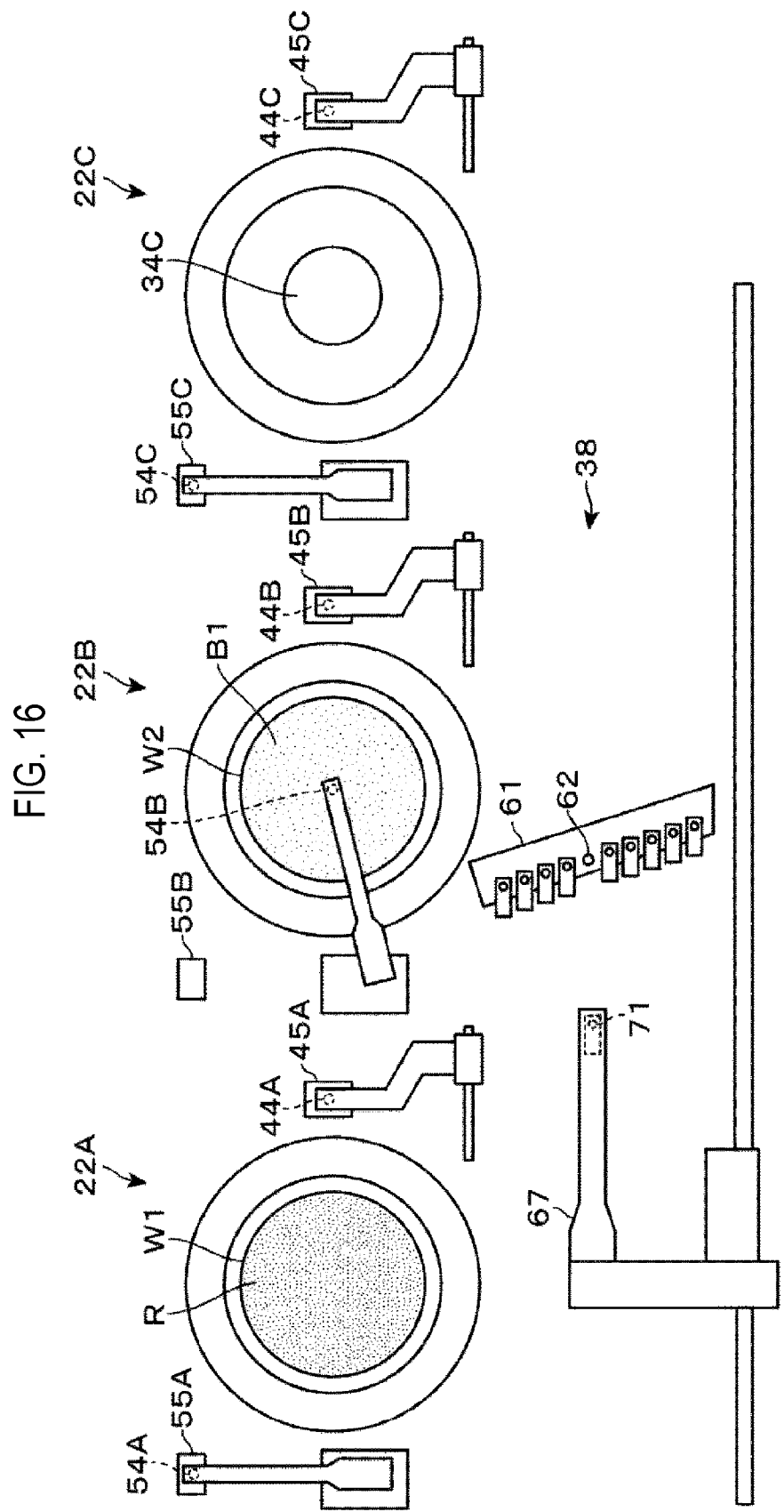
FIG. 16 is an operational view illustrating the operation of the resist coating module.

Then, in the processing part 22A, the resist R is discharged as the operation in the period L5, and the resist R is spread over the entire front surface of the wafer W1 by a centrifugal force (FIG. 15). Thereafter, the discharge of the resist R is stopped, and the resist nozzle 71 is retracted to the rear region 38 as the operation in the period L6, during which the resist R on the front surface of the wafer W1 is dried to become a resist film RE In addition, in the processing part 22B, as the operation in the period L2, the discharge of the thinner B1 from the individual nozzle MB to the wafer W2 at the discharge position is performed (FIG. 16). While the processes are being performed in the processing parts 22A and 22B in this manner, an unload signal of the wafer W3 is output from the temperature adjustment module 12, and a processing schedule in the processing part 22C is set.

Figure 17:
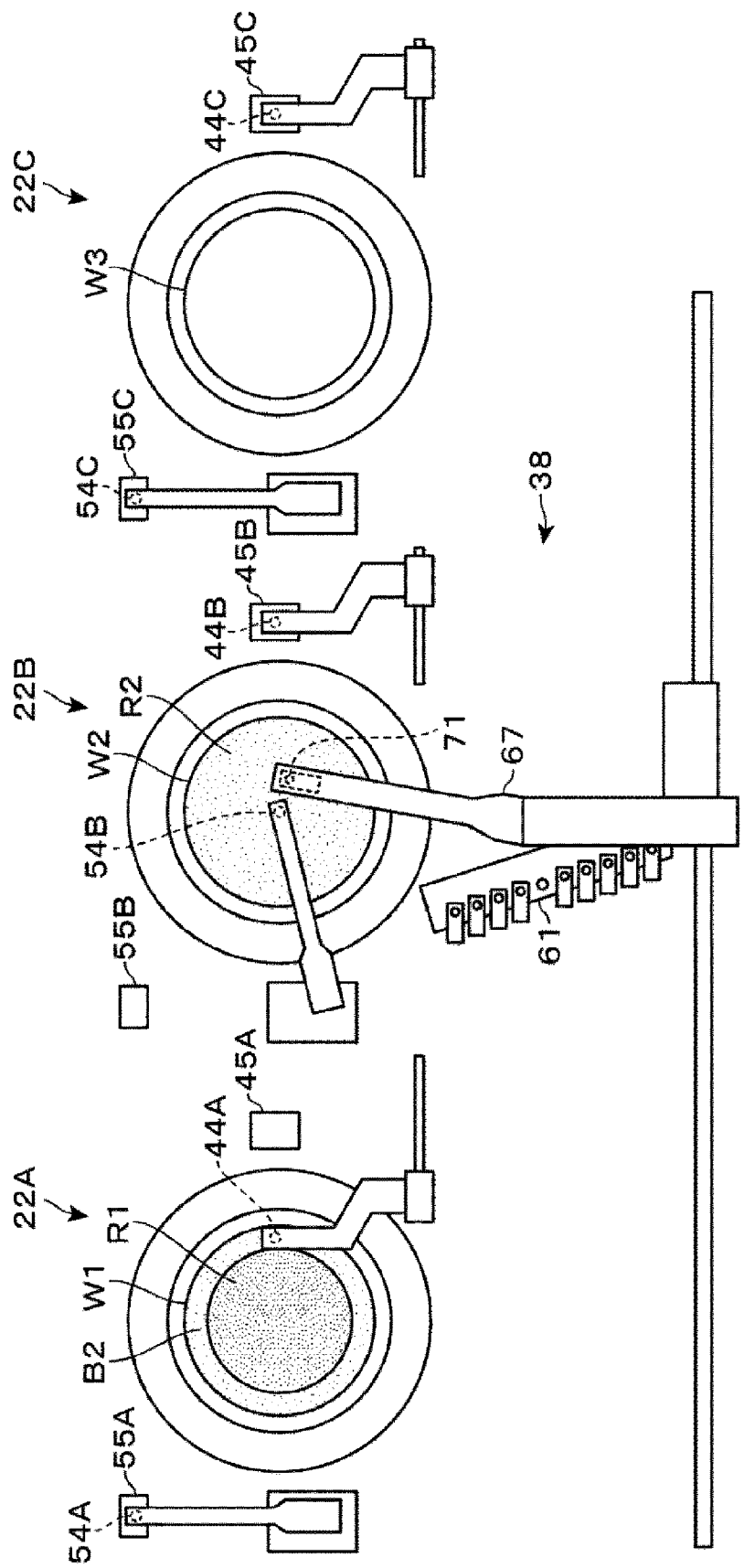
FIG. 17 is an operational view illustrating the operation of the resist coating module.

Thereafter, in the processing part 22A, the peripheral nozzle 44A moves to the processing position and discharges the thinner B2 to the peripheral edge portion of the wafer W1, and the resist film R1 on the peripheral edge portion of the wafer W1 is removed. In the meantime, in the processing part 22B, the movement of the resist nozzle 71 to the immediately-previous standby position is performed as the operation in the period L3. Since the processing schedule of the processing part 22B is set at the start of the period L6 in the processing part 22A, the resist nozzle 71 is directly moved to the immediately-previous standby position, rather than being transferred to the standby part 61, as described above. Meanwhile, the wafer W3 is transferred to the processing part 22C where the wafer W3 is held and rotated by the spin chuck 34C (FIG. 17).

Thereafter, in the processing part 22A, the termination of the discharge of the thinner B2 from the peripheral nozzle 44A and the retraction of the peripheral nozzle 44A to the standby part 45A are sequentially performed, and the processed wafer W1 is unloaded from the processing part 22A. In the meantime, in the processing part 22B, as the operation in the period L4, the retraction of the individual nozzle MB from the discharge position and the movement of the resist nozzle 71 to the discharge position are sequentially performed. Meanwhile, a process is started in the processing part 22C according to the processing schedule, and the movement of the individual nozzles MC from the standby part 55C to the discharge position, which is an operation in the period L1, is performed.

Figure 18:
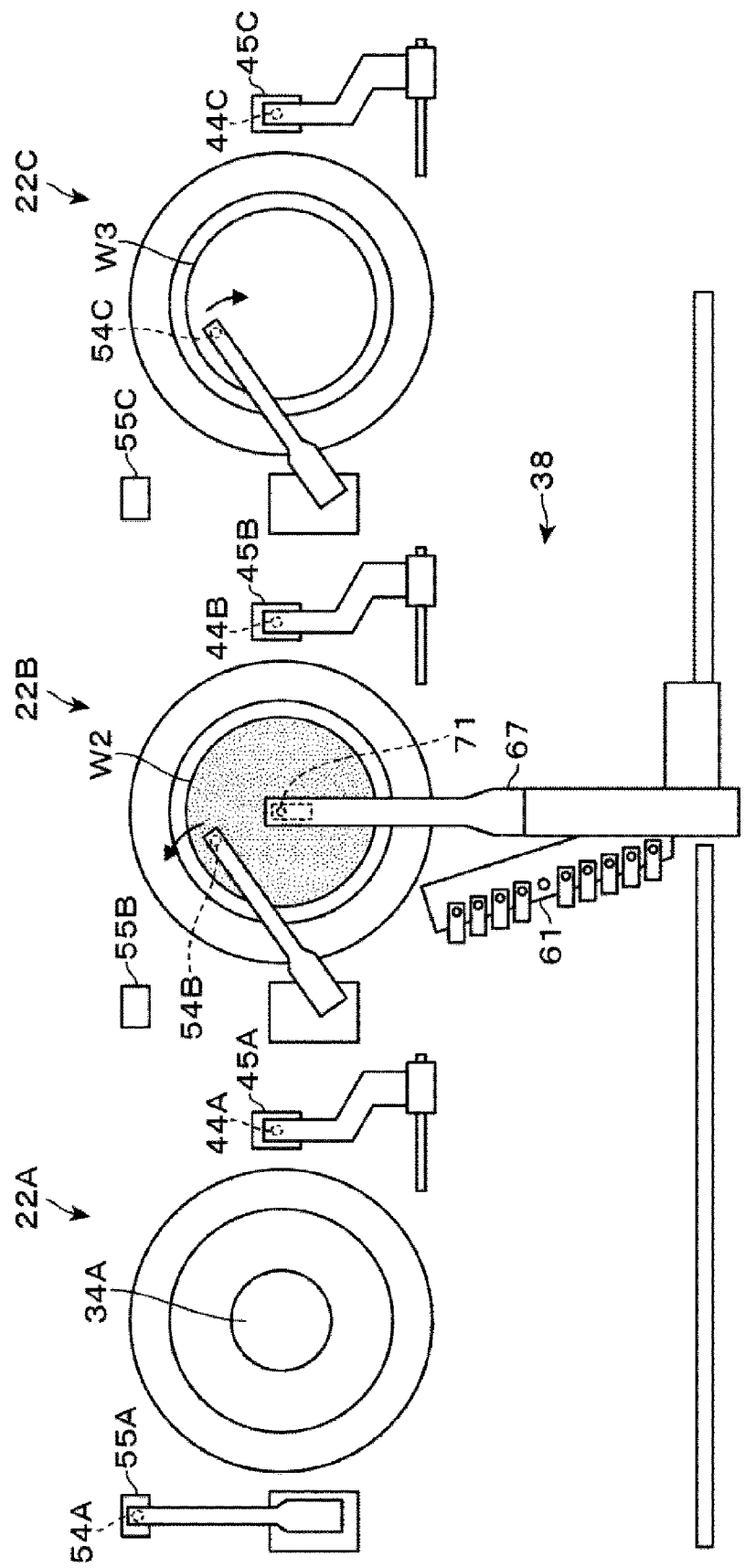
FIG. 18 is an operational view illustrating the operation of the resist coating module.
Figure 19:
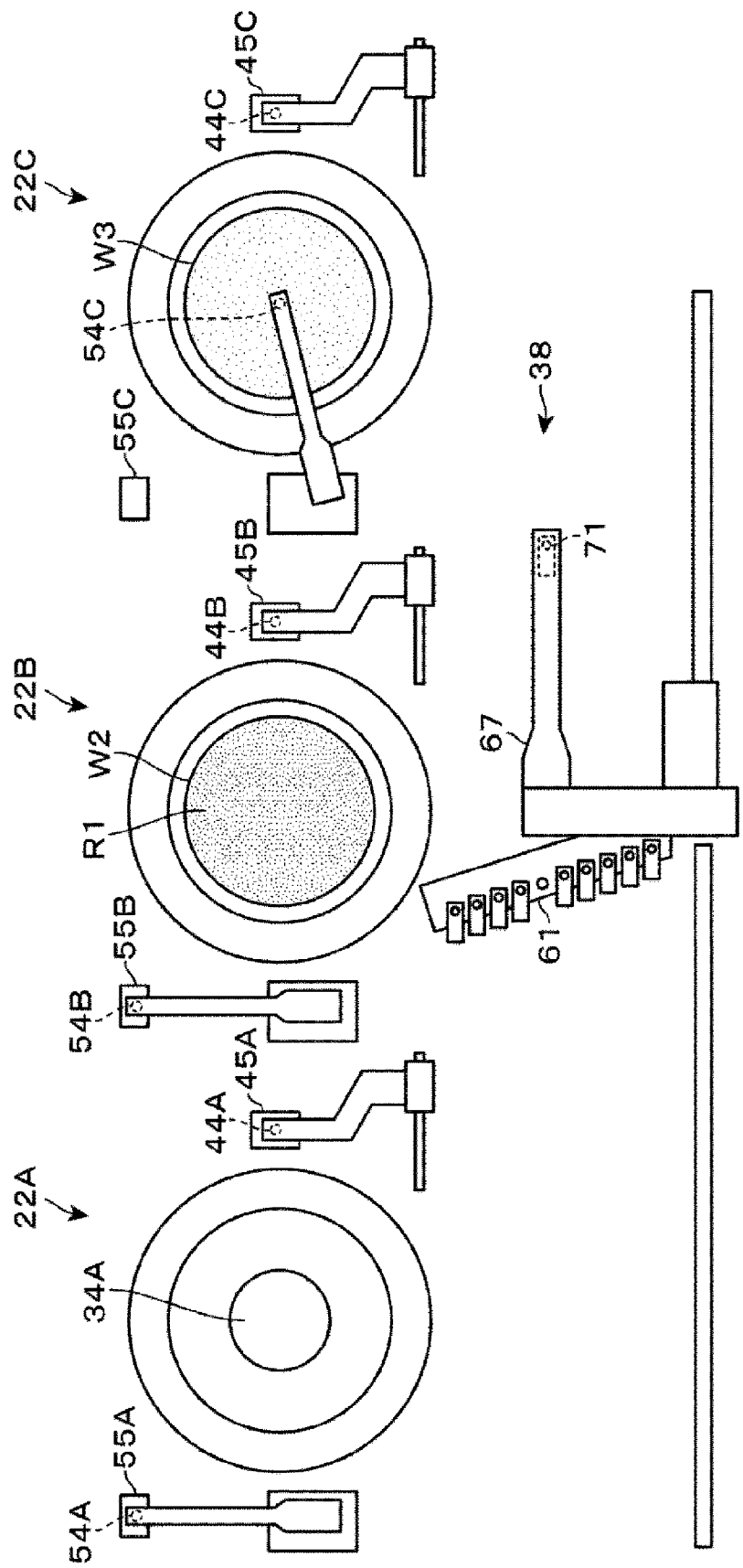
FIG. 19 is an operational view illustrating the operation of the resist coating module.

Then, in the processing part 22B, the discharge of the resist R is performed as the operation in the period L5 (FIG. 18). Thereafter, the discharge of the resist R is stopped, and the resist nozzle 71 is retracted to the rear region 38 as the operation in the period L6. In the meantime, the resist R on the front surface of the wafer W2 is dried to form a resist film RE In addition, in the processing part 22C, as the operation in the period L2, the discharge of the thinner B1 from the individual nozzle MC to the wafer W3 at the discharge position is performed (FIG. 19).

Figure 20:
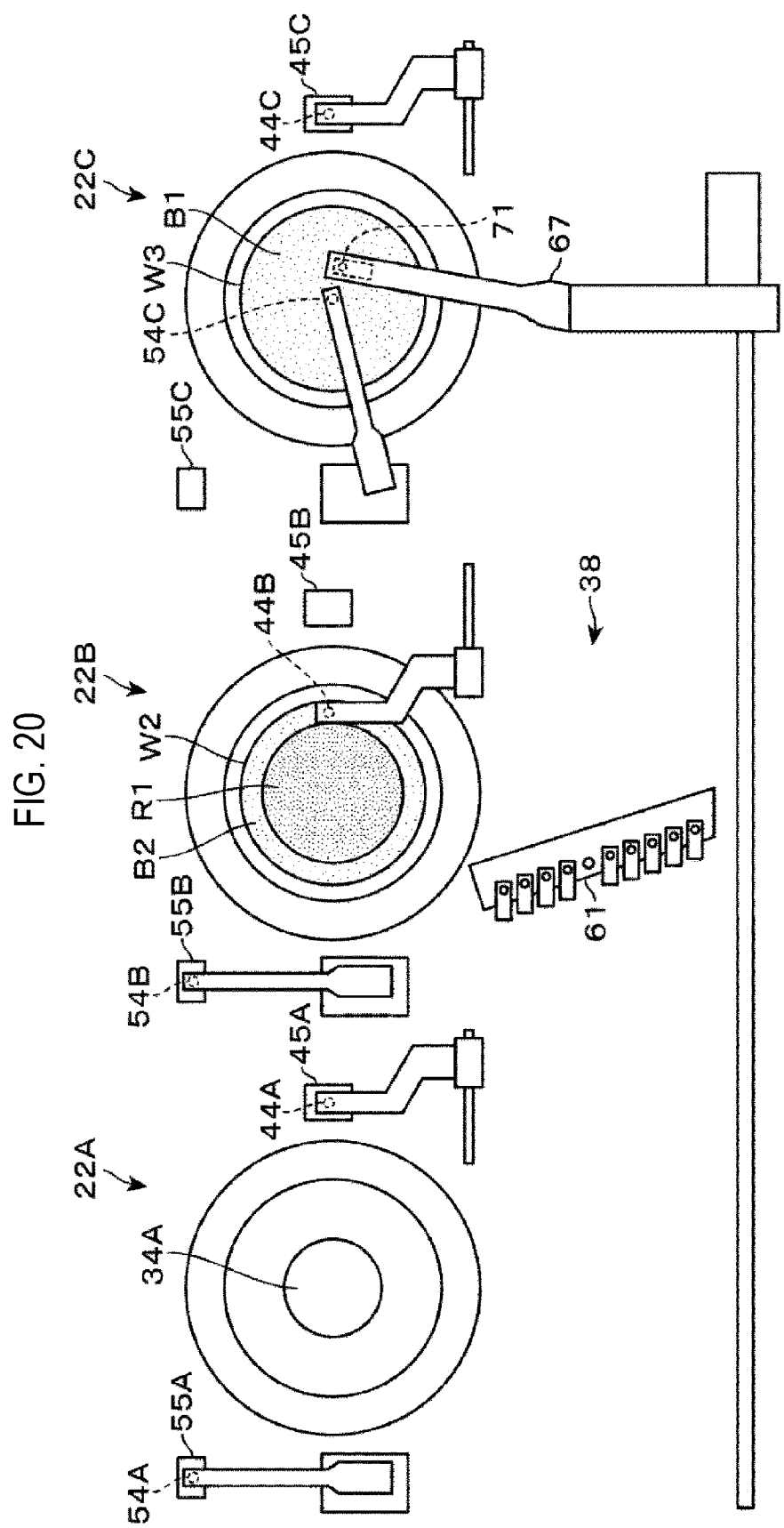
FIG. 20 is an operational view illustrating the operation of the resist coating module.

Thereafter, in the processing part 22B, the peripheral nozzle 44B moves to the processing position and discharges the thinner B2 to the peripheral edge portion of the wafer W2, and the resist film R1 on the peripheral edge portion of the wafer W2 is removed. In the meantime, in the processing part 22C, the direct movement of the resist nozzle 71 to the immediately-previous standby position is performed as the operation in the period L3 (FIG. 20).

Figure 21:
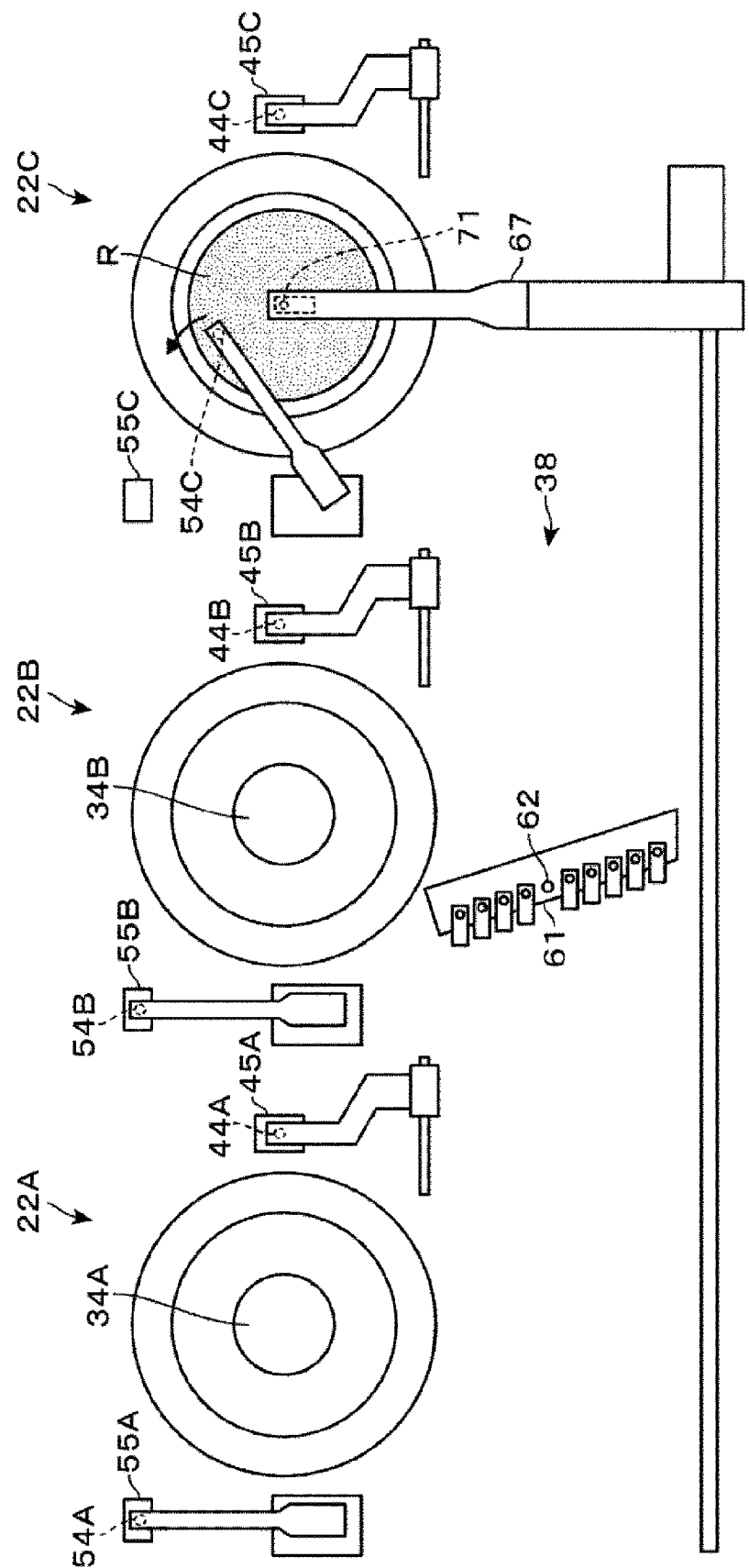
FIG. 21 is an operational view illustrating the operation of the resist coating module.
Figure 22:
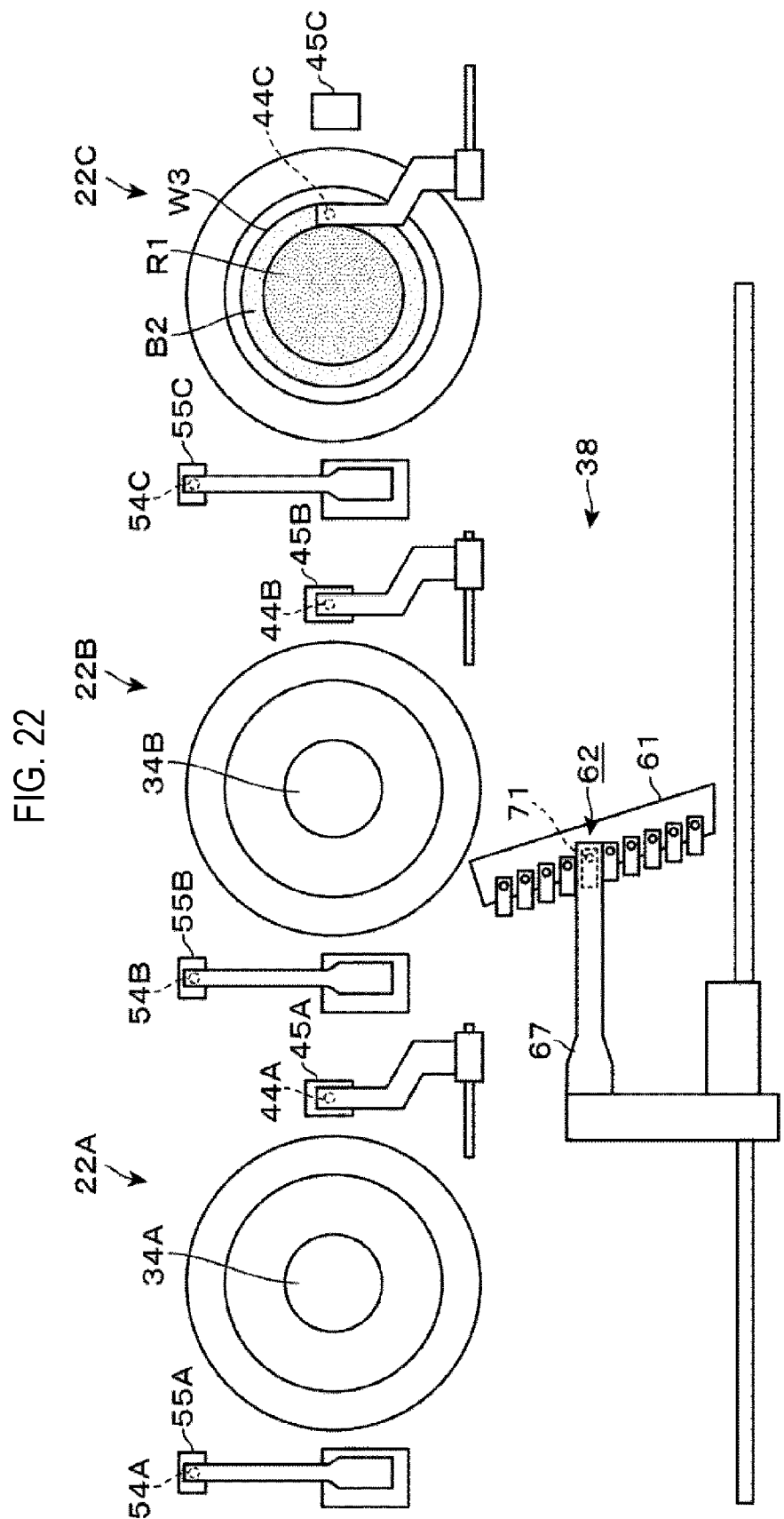
FIG. 22 is an operational view illustrating the operation of the resist coating module.

Thereafter, in the processing part 22B, the termination of the discharge of the thinner B2 from the peripheral nozzle 44B and the retraction of the peripheral nozzle 44B to the standby part 45 are sequentially performed, and the processed wafer W2 is unloaded from the processing part 22A. In the meantime, in the processing part 22C, as the operation in the period L4, the retraction of the individual nozzle 54C from the discharge position and the movement of the resist nozzle 71 to the discharge position are performed, and as the operation in the period L5, the discharge of the resist R is performed (FIG. 21). After the discharge of the resist R is terminated, the resist nozzle 71 is retracted to the rear region 38 as the operation in the period L6. Since the processing schedule for the next wafer W is not set, the resist nozzle 71 is transferred to the standby part 61 and waits at the standby position 62. Meanwhile, in the processing part 22C, the peripheral nozzle 44C moves to the processing position and discharges the thinner B2 to the peripheral edge portion of the wafer W3, and the resist film R1 on the peripheral edge portion of the wafer W3 is removed (FIG. 22). Thereafter, the wafer W3 is unloaded from the processing part 22C.

As described above, in the resist coating module 2, the individual nozzle 54 for performing the cleaning process and the peripheral nozzle 44 for performing the EBR are provided for each processing part 22. The resist nozzle 71, which performs the resist coating used after the cleaning process, is shared among the processing parts 22. The individual nozzle 54, the resist nozzle 71, and the peripheral nozzle 44 may move independently of each other between the standby part outside the cup 31 and a position above the wafer W. Accordingly, while the cleaning process and/or the movement of the individual nozzles 54 for the cleaning process are being performed in another processing part 22 into which a wafer W is loaded later, the coating of the resist in one processing part 22 into which the wafer W has been previously loaded and/or the movement of the resist nozzle 71 from one processing part 22 to another processing part 22 may be performed. Further, regardless of the processing of the wafer W in another processing part 22, the EBR process may be performed in one processing part 22. Therefore, it is possible to obtain high throughput for the resist coating module 2.

In particular, as described above, when the discharge time of the thinner by the individual nozzle 54 is longer than the discharge time of the resist by the resist nozzle 71, the discharge of the resist in one processing part 22 and the movement of the resist nozzle 71 are performed during the discharge time as described above, which is advantageous since a decrease in throughput can be prevented. Further, as described above, in the resist coating module 2, the individual nozzles 54 are moved by the rotation mechanism 52, and the peripheral nozzles 44 are moved by the linear motion mechanism 41, whereby the space for the module can be saved.

As described above, the coating apparatus of Patent Document 1 includes a large number of nozzles. All of these nozzles are shared by the processing parts (processing parts). Accordingly, since a process in another processing part is performed after a process in one processing part has been terminated, it is difficult to improve throughput. In Patent Document 1, each nozzle is similarly transferred from the rear side of a processing part to the respective processing part by the common nozzle transfer mechanism That is, Patent Document 1 does not teach the idea of preventing the apparatus from being bulky by selectively using movement performed by a linear motion mechanism and movement performed by a rotation mechanism depending on nozzles in providing the nozzles having different roles as in the present disclosure.

As described above, during the discharge of the thinner by the individual nozzle 54, the resist nozzle 71 waits at the immediately-previous standby position on the wafer W. Thus, it is possible to quickly switch from the cleaning process to the resist discharge process, thus more reliably increasing throughput. In addition, when the thinner discharge time is longer than the resist discharge time and the difference between these discharge times is greater, the resist nozzle 71 is more likely to wait at the immediately-previous standby position during the discharge of the thinner That is, it becomes easy to set a processing nozzle such that the resist nozzle 71 is disposed at the immediately-previous standby position after a process is performed by the resist nozzle 71 in one processing part 22 and before the discharge of the thinner in another processing part 22 is terminated. That is, even if the resist nozzle 71 is shared by the processing parts 22, the operation thereof does not limit the processing of the wafer W, and the waiting time until resist coating is performed on the wafer W is suppressed, whereby higher throughput can be obtained more reliably.

In addition, as described above, depending on the processing state of a wafer W in one processing part 22, the processing schedule of a wafer W in another processing part 22 is determined. The determination of the processing schedule is performed such that the overlapping period of the processing schedules in respective processing parts 22 becomes longer as described above with reference to FIG. 12. Accordingly, in processing a plurality of wafers W in a continuous manner, it is possible to increase throughput more reliably.

Figure 23:
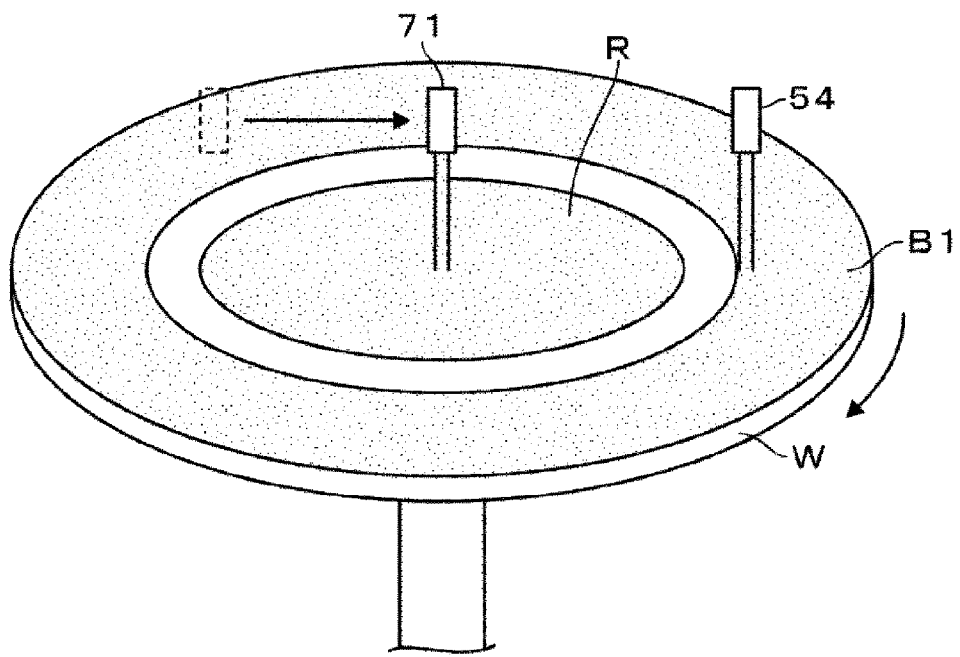
FIG. 23 is an explanatory view illustrating another processing example in the resist coating module.

Next, a processing recipe different from the above-described processing recipe of the thinner and the resist will be described. The resist nozzle 71 is disposed such that the resist is discharged to a first position apart from the center of a rotating wafer W, and the individual nozzle 54 is disposed such that the thinner B1 is discharged to a second position closer to the peripheral edge of the wafer W than the first position. Then, the discharge of each of the resist R and the thinner B1 is performed. As illustrated in FIG. 23, the resist nozzle 71 is moved in the lateral direction such that position at which the resist R is discharged is shifted to a position above the center of the wafer W, and thus the impact at the time of landing liquid on the wafer W is alleviated and the scattering of the liquid from the liquid landing position is suppressed. By supplying the resist R and the thinner B1 in this manner, a liquid collection portion of the resist R is located at the center on the wafer W, and the thinner B1 is supplied to the wafer W so as to surround the liquid collection portion. Thereafter, the rotation speed of the wafer W is increased. Accordingly, at the peripheral edge portion of the wafer W at which the supply of the thinner B1 has been terminated, the resist R is spread so as to have high coatability with respect to the peripheral edge portion, and the entire front surface of the wafer W is more reliably coated with the resist R.

In the processing in FIG. 23, the time zone in which the thinner B1 is discharged and the time zone in which the resist R is discharged may not be clearly separated from each other. That is, without being limited to terminating the discharge from one nozzle and then starting the discharge from another nozzle, it is possible to perform a process such that the time zone in which the resist R is discharged and the time zone in which the thinner B1 is discharged overlap. In FIG. 23, there is shown a state in which the time zone in which the resist R is discharged and the time zone in which the thinner B1 is discharged overlap each other. In a case in which a processing recipe is set such that the time zone in which the thinner B1 is discharged and the time zone in which the resist R is discharged overlap each other, the shared arm 67, which holds the resist nozzle 71, may be operated at a timing according to the processing recipe. When the processing recipe described with reference to FIG. 23 is performed, this is preferable because the movement trajectories D1 to D3 of the nozzles described above do not overlap even on the center of the wafer W.

The processing liquid supplied from the peripheral nozzle 44 is not limited to the thinner. For example, a processing liquid for forming a protective film may be discharged instead of the thinner, so that the peripheral edge portion of the wafer W after the formation of the resist film may be covered with the protective film. This protective film is a protective film for preventing film peeling at the peripheral edge portion of the wafer W. When such a protective film is formed, it may be required to increase the uniformity of the film thickness in the circumferential direction of the wafer W. Assuming that the peripheral nozzle 44 is moved by the rotation mechanism as described above, when a liquid landing position is shifted in the radial direction in order to change the width of the region in which the protective film is formed, the liquid landing position may also be shifted in the circumferential direction of the wafer W. As a result, the uniformity of the film thickness in the circumferential direction of the wafer W may be reduced. From the viewpoint of preventing this, it is preferable that the peripheral nozzle 44 be moved by the linear motion mechanism 41 as described above.

When the resist discharge time is longer than the discharge time of the thinner from the nozzle that performs cleaning (pre-wet), a nozzle that discharges the thinner may be shared by respective processing parts 22, and a nozzle that discharges the resist may be provided for each processing part 22. That is, a nozzle having a long processing liquid discharge time is provided for each processing part 22, and a nozzle having a short processing liquid discharge time is shared by the processing parts 22. With such a configuration, the discharge of the processing liquid from the nozzle having a short discharge time and/or the movement of the nozzle having a short discharge time between the processing parts 22 may be performed while the processing liquid is being discharged from the nozzle having a long discharge time. Accordingly, throughput can be increased.

A camera for capturing an image of the resist nozzle 71 held by the shared arm 67 from a different direction from the camera 84 provided on the shared arm 67 may be provided to be fixed to the cup 31. In some embodiments, the camera 84 may not be provided on the shared arm 67, and a plurality of cameras that capture images of the resist nozzle 71 held by the shared arm 67 from different directions may be fixedly provided on the cup 31. The images obtained from the cameras fixed on the cup 31 may be used to detect various abnormalities, similarly to the images obtained from the camera 84.

Based on a time difference between the start timing of a series of processes in one processing part 22 and the start timing of a series of processes in another processing part 22 described with reference to FIG. 12, it may be determined whether or not the nozzle 71, which has been used in one processing part 22, is made to wait at the standby position 62 in the standby part 61. That is, when the time difference is shorter than a predetermined set time, the resist nozzle 71 is made to wait, for example, above the standby position 62, rather than being transferred to the standby position 62. Meanwhile, when the time difference is equal to or longer than the predetermined set time, the resist nozzle 71 is transferred to and made to wait at the standby position 62.

The arm 53 may be provided with a plurality of individual nozzles 54 configured to discharging different types of thinner, and the thinner may be discharged from any one selected individual nozzle 54. In addition, the number of the processing parts 22 is not limited to three, and may be four or more. In addition, the number of the processing parts 22 may be two. However, by configuring the resist supply mechanism 6 to be shared by a relatively large number of processing parts 22, it is possible to reduce the number of modules and the number of processing liquid supply lines in providing a plurality of resist coating modules 2 in the apparatus, and to reduce the manufacturing cost of the apparatus. In addition, it is possible to achieve a reduction in the number of processes for manufacturing and maintenance. As described above, the resist coating module 2 is advantageous because it is configured to suppress a decrease in throughput even if the number of the processing parts 22 is large. In addition, the coating apparatus of the present disclosure is not limited to a configuration for coating a resist to form a resist film. For example, the technology of the present disclosure may be applied to an apparatus for forming an anti-reflection film by coating a processing liquid for anti-reflection film formation or an apparatus for forming an insulation film by coating a processing liquid for insulation film formation. That is, a configuration may be employed in which processing liquids for forming these films are supplied to the processing parts 22 from a shared nozzle.

According to the present disclosure in some embodiments, high throughput can be obtained and space can be saved in a coating apparatus that forms a coating film by supplying a coating liquid to a substrate.

It should be noted that the embodiments disclosed herein are exemplary in all respects and are not restrictive. The above-described embodiments may be omitted, replaced or modified in various forms without departing from the scope and spirit of the appended claims.

What is claimed is:

1. A coating apparatus comprising:
   a plurality of substrate holders arranged in a left-right direction and each configured to hold a substrate;
   a first nozzle provided to be shared by the plurality of substrate holders and configured to discharge a first processing liquid to the substrate at a first discharge position on the substrate held by each of the plurality of substrate holders;
   a first arm supporting the first nozzle and configured to move the first nozzle in a plan view between a first standby area, which is outside a region in which the substrate is held by each of the plurality of substrate holders in a plan view, and the first discharge position;
   a first illumination provided on a distal end side of the first arm and configured to move with the first nozzle and to irradiate the first nozzle with light; and
   a camera provided on the distal end side of the first arm and configured to move with the first nozzle and to capture an image of the first nozzle irradiated with the light from the first illumination,
   wherein the first illumination is configured to emit the light obliquely downward toward a base end side of the first arm.

2. The coating apparatus of claim 1, further comprising a first support supporting the first illumination.

3. The coating apparatus of claim 1, further comprising a second support extending on a base side of the first arm when viewed in a direction in which the first arm extends,
   wherein a second illumination is provided at the second support.

4. The coating apparatus of claim 3, wherein the second illumination is configured to emit the light that irradiates the first nozzle.

5. The coating apparatus of claim 3, wherein the second support extends to left and right when viewed in the direction in which the first arm extends.

6. The coating apparatus of claim 1, wherein the camera is provided such that the first nozzle and a region below the first nozzle are included in a field of view of the camera.

7. The coating apparatus of claim 5, wherein the camera, the first illumination, and the second illumination are configured to be movable by sharing a driver of the first nozzle,
   the second illumination is provided at each end of the left side and the right side of the support, and
   the second illumination is configured to illuminate the first nozzle from each of two regions separated by a straight line connecting the first nozzle and the camera in a plan view.

8. The coating apparatus of claim 1, wherein the coating apparatus further comprises:
   a second nozzle provided for each of the plurality of substrate holders and configured to discharge a second processing liquid to the substrate at a second discharge position on the substrate held by each of the plurality of substrate holders;
   a third nozzle provided for each of the plurality of substrate holders and configured to move independently of the first nozzle and the second nozzle and discharge a third processing liquid to the substrate at a third discharge position on the substrate held by each of the plurality of substrate holders;

a second arm supporting the second nozzle and configured to be turned such that the second nozzle is moved in a plan view between a second standby area, which is outside a region in which the substrate is held by each of the plurality of substrate holders in a plan view, and the second discharge position;

a first linear mover configured to move the first arm in the left-right direction; and a second linear mover configured to linearly move the third nozzle in a plan view between a third standby area, which is outside the region in which the substrate is held by each of the plurality of substrate holders in a plan view, and the third discharge position.

9. The coating apparatus of claim 8, further comprising a controller configured to output a control signal such that a period during which a first continuous process is performed on a first substrate and a period during which a second continuous process is performed on a second substrate overlap each other, wherein the first substrate is a substrate held by a first substrate holder among the plurality of substrate holders, the second substrate is a substrate held by a second substrate holder among the plurality of substrate holders, the first continuous process is a process performed on the first substrate from a timing at which the second nozzle starts to move from the second standby area to a timing at which the first nozzle terminates the discharge of the first processing liquid, and the second continuous process is a process performed on the second substrate from a timing at which the second nozzle starts to move from the second standby area to a timing at which the first nozzle terminates the discharge of the first processing liquid.

10. The coating apparatus of claim 9, wherein the controller is configured to determine a start timing of the second continuous process depending on a timing at which the first continuous process is terminated.

11. The coating apparatus of claim 10, wherein the controller is configured to adjust, within a preset range, an interval from termination of the discharge of the second processing liquid to the second substrate until the discharge of the first processing liquid to the second substrate.

12. The coating apparatus of claim 8, wherein the first nozzle waits above the substrate while the second processing liquid is being discharged from the second nozzle to the substrate.

13. The coating apparatus of claim 9, wherein, based on whether or not the second substrate is to be transferred to the second substrate holder while the first continuous process is being performed on the first substrate, the controller is configured to determine whether to move the first nozzle to the first standby area after the discharge of the first processing liquid to the first substrate or whether to move the first nozzle toward the first discharge position corresponding to the second substrate without moving the first nozzle to the first standby area.

14. The coating apparatus of claim 9, wherein, depending on an interval between a start timing of the first continuous process on the first substrate held previously by the first substrate holder among the plurality of substrate holders and a start timing of the second continuous process on the second substrate held currently by the second substrate holder among the plurality of substrate holders, the controller is configured to determine whether to move the first nozzle to the first standby area after the discharge of the first processing liquid to the first substrate or whether to move the first nozzle toward the first discharge position corresponding to the second substrate without moving the first nozzle to the first standby area.

* * * * *